(12) United States Patent
Park et al.

(10) Patent No.: US 6,574,757 B1
(45) Date of Patent: Jun. 3, 2003

(54) INTEGRATED CIRCUIT SEMICONDUCTOR DEVICE HAVING BUILT-IN SELF-REPAIR CIRCUIT FOR EMBEDDED MEMORY AND METHOD FOR REPAIRING THE MEMORY

(75) Inventors: Jin-Young Park, Kyunggi-go (KR); Heon-Cheol Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/566,346

(22) Filed: May 8, 2000

(30) Foreign Application Priority Data

Jan. 28, 2000  (KR) .......................................... 2000-4376

(51) Int. Cl.[7] .......................... G11C 29/00; G11C 7/00; G01R 31/28
(52) U.S. Cl. ........................................ 714/710; 714/723
(58) Field of Search ................................ 714/710, 711, 714/718, 722, 723, 7; 365/200, 201

(56) References Cited

U.S. PATENT DOCUMENTS

| | | | |
|---|---|---|---|
| 5,163,023 A | * 11/1992 | Ferris et al. | ................. 365/200 |
| 5,515,333 A | *  5/1996 | Fujita et al. | ................. 365/229 |
| 5,920,515 A |   7/1999  | Shaik et al. | ................. 365/200 |
| 5,987,632 A |  11/1999  | Irrinki et al. | ................ 714/711 |

* cited by examiner

Primary Examiner—Christine T. Tu
(74) Attorney, Agent, or Firm—Mills & Onello, LLP

(57) ABSTRACT

An integrated circuit semiconductor device comprises a built-in self-repair (BISR) circuit including a plurality of row fill entries and a plurality of column fill entries for storing faulty memory cell information of an embedded memory. Sizes of the row and column fill entries are determined by the numbers of row and column redundancies of the embedded memory. The row/column fill entries store row/column addresses of the faulty memory cells, and the number of the faulty memory cells occurring at the same row/column address, respectively. In addition, the row/column fill entries include pointers for indicating opposite entries storing the column/row address corresponding to the row/column address. For repairing the faulty memory cells with the row and column redundancies, the BISR circuit selects row/column fill entries and deletes the number of the fault memory cells stored in the opposite fill entry. Thus, the information is deleted from the row/column fill entries with the exception of information to be repaired. Therefore, the self-repair of the faulty memory cells can be performed in the BISR circuit in response to the remaining information.

19 Claims, 29 Drawing Sheets

Fig. 2
(Prior Art)

| Valid | Row Address | Row Hit Count | Column Address | Column Hit Count | Row Must | Column Must |
|---|---|---|---|---|---|---|
| Valid | Row Address | Row Hit Count | Column Address | Column Hit Count | Row Must | Column Must |
| Valid | Row Address | Row Hit Count | Column Address | Column Hit Count | Row Must | Column Must |
| ... | ... | ... | ... | ... | ... | ... |
| Valid | Row Address | Row Hit Count | Column Address | Column Hit Count | Row Must | Column Must |

| Valid | Row Address | Row Hit Count | Column Fill Entry Pointer X C | Row Must |
|---|---|---|---|---|
| Valid | Row Address | Row Hit Count | Column Fill Entry Pointer X C | Row Must |
| Valid | Row Address | Row Hit Count | Column Fill Entry Pointer X C | Row Must |
| . . . | . . . | . . . | . . . | . . . |
| Valid | Row Address | Row Hit Count | Column Fill Entry Pointer X C | Row Must |

| Valid | Column Address | Column Hit Count | Row Fill Entry Pointer X R | Column Must |
|---|---|---|---|---|
| Valid | Column Address | Column Hit Count | Row Fill Entry Pointer X R | Column Must |
| Valid | Column Address | Column Hit Count | Row Fill Entry Pointer X R | Column Must |
| . . . | . . . | . . . | . . . | . . . |
| Valid | Column Address | Column Hit Count | Row Fill Entry Pointer X R | Column Must |

26A — (first row)

| Valid | Row Address | Row Hit Count | Column Fill Entry Pointer | Row Must |
|---|---|---|---|---|
| 1bit | ($\log_2 M$)bit | $\{\lfloor(\lceil\log_2 C\rceil)\rfloor+1\}$bit | $\lceil\log_2(C+CR)\rceil$ bit | 1bit |

| Valid | Column Address | Column Hit Count | Row Fill Entry Pointer | Column Must |
|---|---|---|---|---|
| 1bit | ($\log_2 N$)bit | $\{\lfloor(\lceil\log_2 R\rceil)\rfloor+1\}$bit | $\lceil\log_2(R+RC)\rceil$ bit | 1bit |

26A

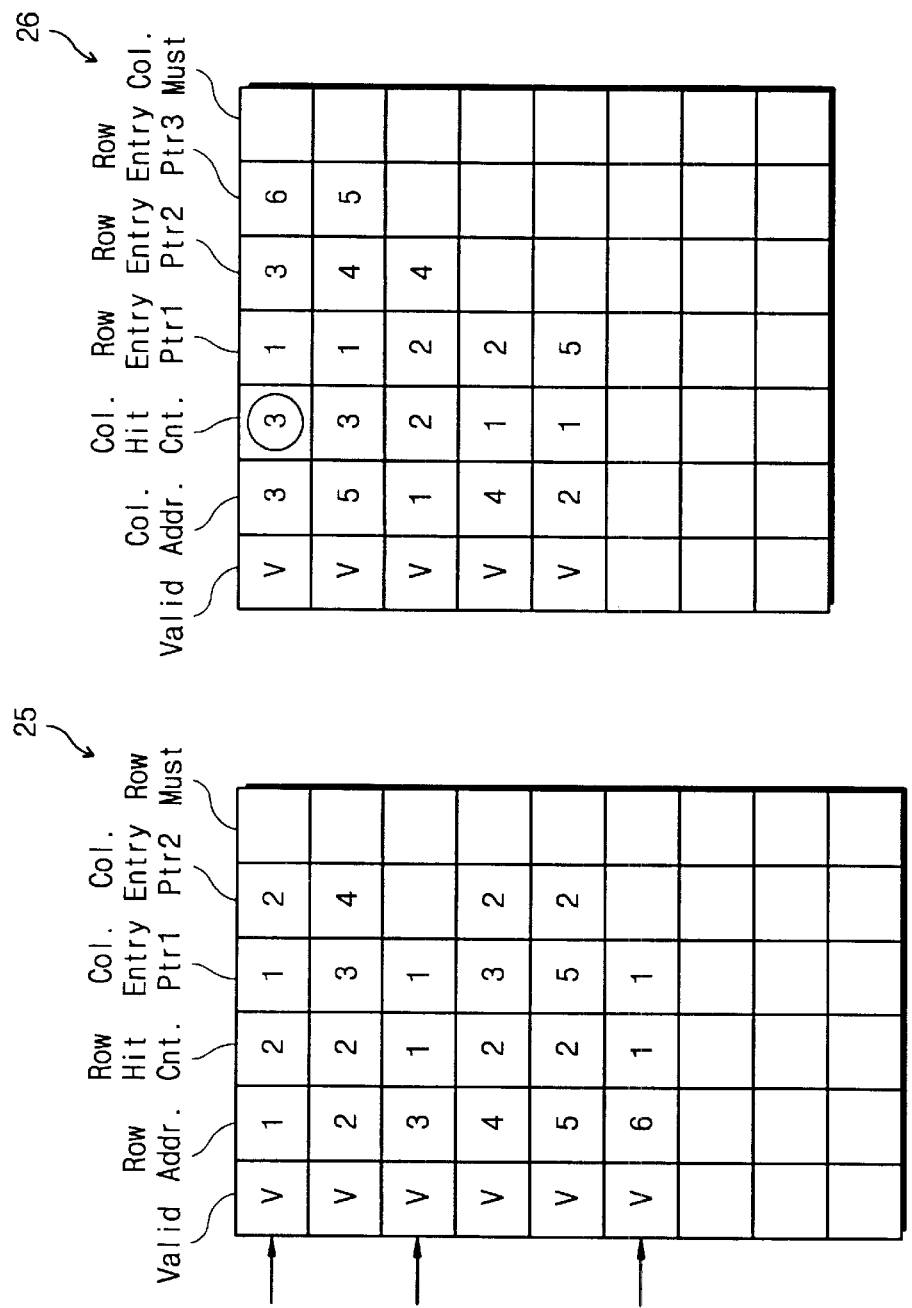

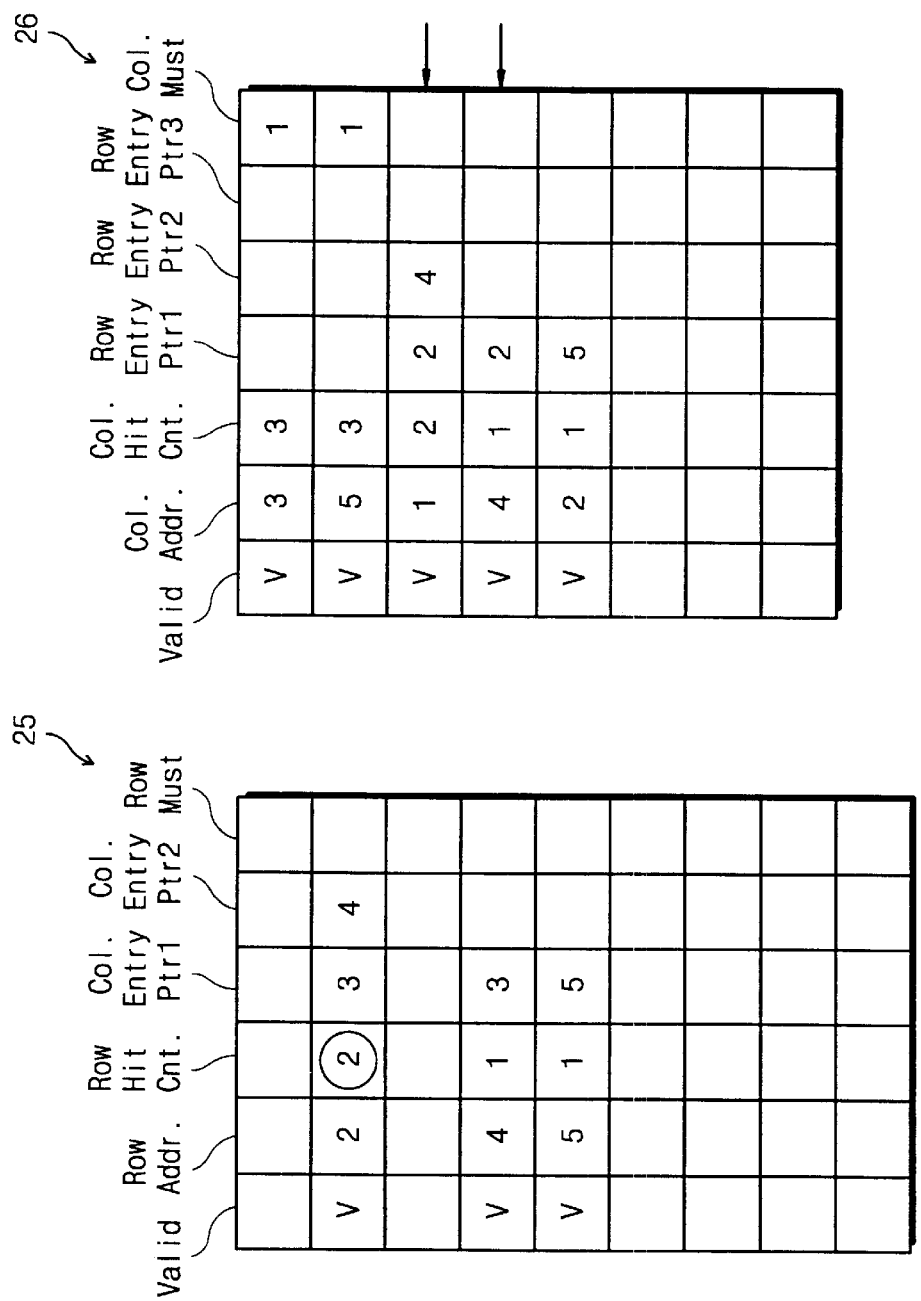

Fig. 7D

Table 25:

| Valid | Row Addr. | Row Hit Cnt. | Col. Entry Ptr1 | Col. Entry Ptr2 | Col. Row Must |
|---|---|---|---|---|---|
| V | 2 | 2 | | | 1 |
| | | | | | |
| V | 4 | (1) | 3 | | |
| V | 5 | 1 | 5 | | |
| | | | | | |
| | | | | | |
| | | | | | |

Table 26:

| Valid | Col. Addr. | Col. Hit Cnt. | Row Entry Ptr1 | Row Entry Ptr2 | Row Entry Ptr3 | Col. Must |
|---|---|---|---|---|---|---|
| V | 3 | 3 | | | | 1 |
| V | 5 | 3 | | 4 | | 1 |
| V | 1 | 1 | | | | |
| | | | | | | |
| V | 2 | 1 | 5 | | | |
| | | | | | | |
| | | | | | | |
| | | | | | | |

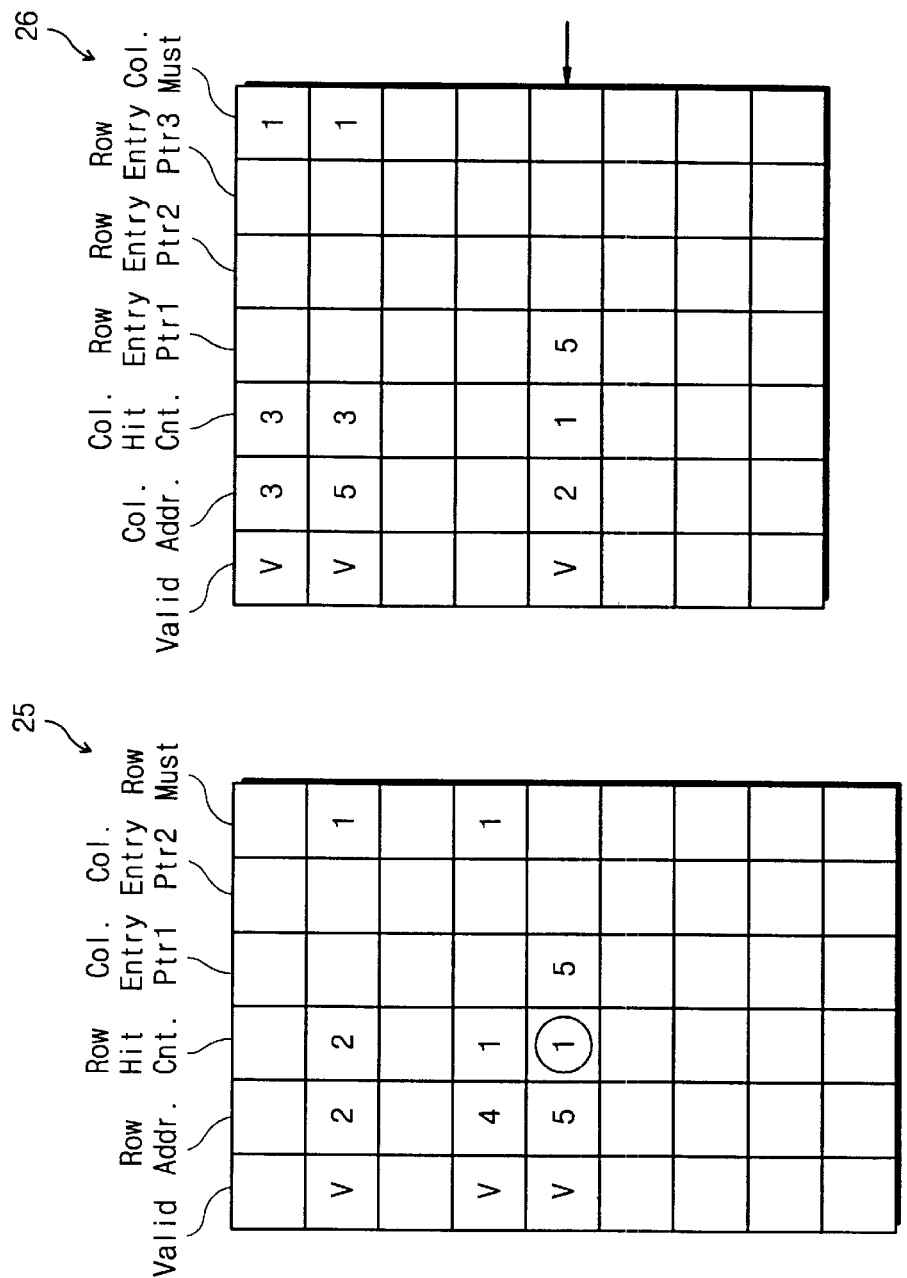

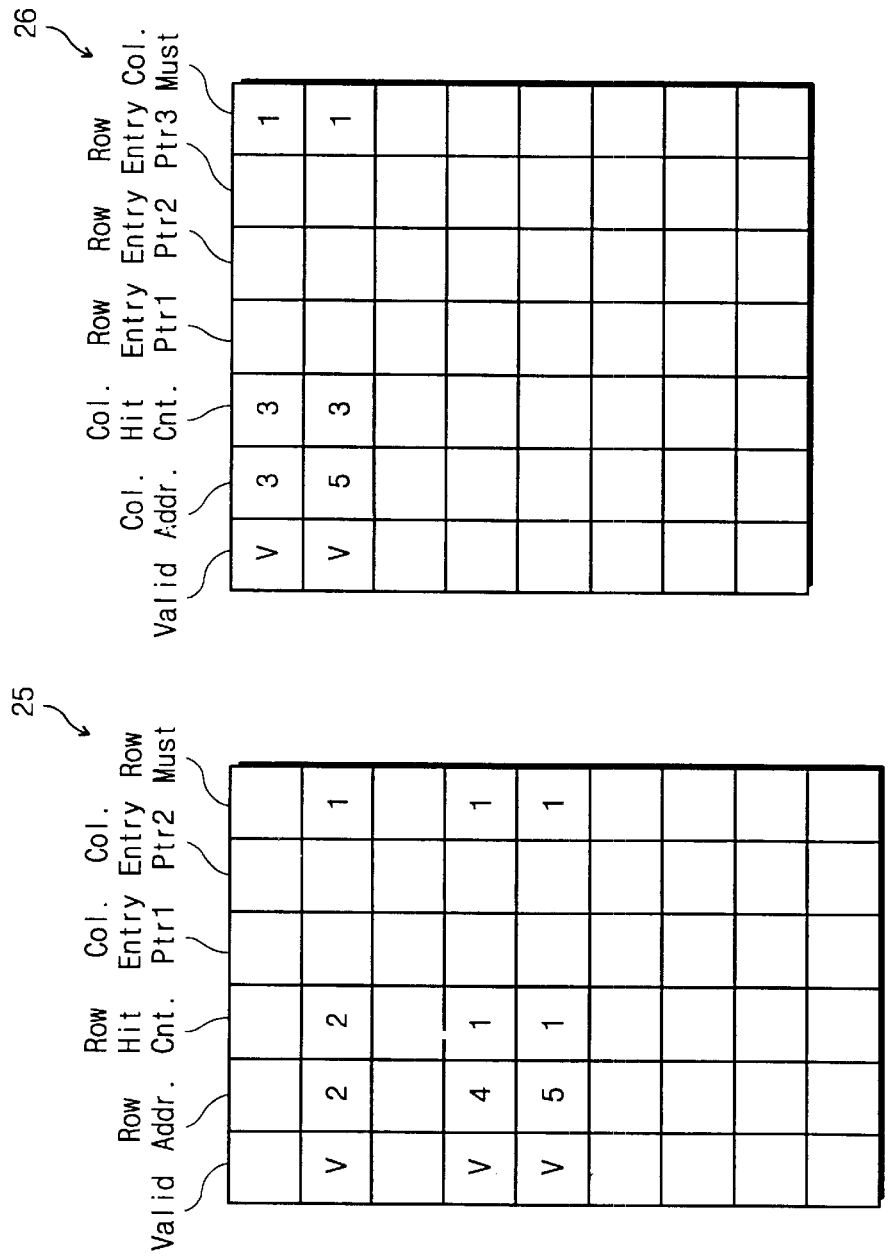

INTEGRATED CIRCUIT SEMICONDUCTOR DEVICE HAVING BUILT-IN SELF-REPAIR CIRCUIT FOR EMBEDDED MEMORY AND METHOD FOR REPAIRING THE MEMORY

FIELD OF THE INVENTION

The present invention relates to a circuit and method for built-in self-test (BIST) and built-in self-repair (BISR) for a memory circuit in a semiconductor integrated circuit device.

BACKGROUND OF THE INVENTION

Recently, core-based integrated circuit (IC) designs are drawing great attention, as the system-on-a-chip (SOC) design style gains momentum as a new design trend. Accordingly, a memory core or an analog core as well as a central processing unit (CPU) core are frequently used in the IC design. With the trend of SOC design, a complex circuit or system chip such as a CPU requires embedded memories of ever-higher capacity to improve system bandwidth.

Modern technology is capable of achieving high memory capacity while requiring a relatively small die size. Since embedded memories in a circuit have relatively higher complexity and share more signals than other logic blocks, they have higher failure rates. In order to solve this problem, designers commonly add redundancy to the embedded memory.

Semiconductor memory devices are commonly tested by an external memory tester or Automatic Test Equipment (ATE) which physically repairs detected faulty memory cells (for example through laser zapping) through a software repair algorithm, after determining whether the faulty memory cells are repairable or not. To test the SOC according to the above-mentioned method, a core and an embedded memory must be tested separately, and for this reason additional external pins are required. As a result, the SOC test becomes more complex and production cost of the SOC is high.

To address this issue, the SOC commonly comprises a built-in self test (BIST) circuit for performing self-test, and a built-in self repair (BISR) circuit for performing self-repair. The BISR circuit includes a repair algorithm for determining whether the faulty memory cells are repairable or not, and for performing logical repair through software. As described above, the repair method of the BISR circuit is different from the external memory tester or the ATE performing physical repair. An embodiment of above described self-test and self-repair becomes an essential part in recent processor design techniques developing into the SOC. Examples of the BIST circuit and BISR circuit can be found in U.S. Pat. No. 5,920,515 to Shaik et al., issued on July 1999, REGISTER-BASED REDUNDANCY CIRCUIT AND METHOD FOR BUILT-IN SELF-REPAIR IN A SEMICONDUCTOR MEMORY DEVICE; and U.S. Pat. No. 5,987,632 to Irrinki et al., issued on November 1999, METHOD OF TESTING MEMORY OPERATIONS EMPLOYING SELF-REPAIR CIRCUITRY AND PERMANENTLY DISABLING MEMORY LOCATIONS.

Generally, repair methods employing the redundancy cells determine which word line and bit line of the faulty memory cells are replaced to the redundancy cells through a depth first search (DFS), case by case, by constructing a binary search tree with word lines (i.e., row addresses) and bit lines (i.e., column addresses) of the faulty memory cells via software. In this case, the technique consumes $O(2^n)$ of test time, meaning that the operation takes $2^n$ of time, assuming the time required to execute one operation (for example, multiplication) is n. The required time forms an exponential function against the row and column redundancies and distribution of the faulty memory cells. Thus, the repair method is not efficient when the number of the redundancies is great and when the memory includes many faulty memory cells. This problem is referred to as an "NP-completeness" problem. To solve the problem, a heuristic method is used. The heuristic method solves a given problem through an experiential knowledge obtained by trial and error. If any algorithm is adopted in the NP-completeness problem, it may efficient to restrict a range of the problem to within extremely narrow limits. In that case, it is impossible to embody the NP-completeness problem to hardware without restricting the limits.

For this reason, some SOCs embedding the BISR circuit restrict the limits to be repaired. For example, the numbers of the row and column redundancies are restricted to within 1, respectively. In case that the respective redundancies are one or one pair, the structure of the BISR circuit becomes simple. In that case, the SOC has a restriction that the SOC can repair only one row and one column.

However, considering the tendency that SOC requires an embedded memory with much higher capacity, additional redundancies are required to repair any additional faulty memory cells occurring in the embedded memory. If the faulty memory cells of the embedded memory are not repaired completely, the reliability of the SOC can be adversely affected by faulty memory cells of the relatively inexpensive embedded memory, even though the relatively expensive core such as a central processing unit (CPU) is fault free.

SUMMARY OF THE INVENTION

A novel BISR circuit and a repair method are therefore required to repair the faulty memory cells of an embedded memory having multiple redundancies, in a more precise manner.

It is therefore an object of the present invention to provide an integrated circuit semiconductor device having a BISR circuit for an embedded memory with multiple redundancies.

It is another object of the invention to provide a repair method of a BISR circuit for an embedded memory with multiple redundancies.

In order to attain the above objects, according to an aspect of the present invention, there is provided an integrated circuit semiconductor device comprising an embedded memory including multiple row and column redundancies; a built-in self-test circuit for detecting faulty memory cells of the memory; and a built-in self-repair circuit for storing the detected faulty memory cell information by splitting information into row information and column information, determining repair methods of the faulty memory cells in response to the row and column information, and generating repaired addresses to the memory in response to the determined repair methods.

The built-in self-repair circuit preferably includes a built-in self-repair controller for controlling operation of the built-in self-repair circuit; a first data storing means including a plurality of entries having a plurality of data fields, for storing row addresses of the faulty memory cells and the number of the faulty memory cells occurring at a common row address; a first logic unit for storing the row addresses and the number of the faulty memory cells to the first data storing means under control of the built-in self-repair controller; a second data storing means including a plurality of entries having a plurality of data fields, for storing column addresses of the faulty memory cells and the number of the faulty memory cells occurring at the same column address; a second logic unit for storing the column addresses and the number of the faulty memory cells to the second data storing means under control of the built-in self-repair controller; a third logic unit for storing entry locations of opposite data storing means storing column and row addresses corresponding to row and column addresses of the first and second data storing means, and for decreasing the number of faulty memory cells stored at the entry locations of the opposite data storing means under control of the built-in self-repair controller, and an address checker for generating repaired row and column addresses to the memory in response to the row and column addresses of the faulty memory cells under control of the built-in self-repair controller.

The built-in self-repair circuit preferably first determines the repair methods of either of the first data storing means or the second data storing means, depending on which of the first and second data storing means has fewer entries. The built-in self-repair circuit may also determine the repair methods of the first or second data storing means by selecting entries composing the first or second data storing means in order of the number of the stored faulty memory cells.

The third logic unit preferably decreases the number of the faulty memory cells stored in the opposite data storing means appointed by the selected entry by 1 when one or more entries are selected to determine the repair methods, and deletes the entry of the opposite data storing means when the decreased number of the faulty memory cells is zero.

Each entry included in the first data storing means preferably comprises a first data field for indicating validity of the row information stored in the entry; a second data field for storing the row address of the faulty memory cells; a third data field for storing the number of the faulty memory cells having the same row address stored in the second data field; a fourth data field for storing the entry location of the second data storing means storing the column address corresponding to the row address of the faulty memory cells stored in the second data field; and a fifth data field for storing determined repair method of the faulty memory cells. The third data field preferably includes $\lfloor \log_2 C \rfloor + 1$ bits, and the fourth data field includes $\lceil \log_2(C+CR) \rceil$ bits as much as C, when the memory includes R row redundancies and C column redundancies. The third data field may further comprise of C+1 bits including a least significant bit being set to 1 which is shifted to left whenever the faulty memory cell having the same row address is detected, and the fourth data field is preferably composed of C bits for indicating the entry location as bit flags, when the memory includes R row redundancies and C column redundancies.

Each entry included in the second data storing means comprises a first data field for indicating validity of the column information stored in the entry; a second data field for storing the column address of the faulty memory cells; a third data field for storing the number of the faulty memory cells having the same column address stored in the second data field; a fourth data field for storing the entry location of the first data storing means storing the row address corresponding to the column address of the faulty memory cells stored in the second data field; and a fifth data field for storing determined repair method of the faulty memory cells.

The third data field may be composed of $\lfloor \log_2 R \rfloor + 1$ bits, and the fourth data field is composed of $\lceil \log_2 (R+RC) \rceil$ bits as much as R, when the memory includes R row redundancies and C column redundancies. Optionally, the third data field may be composed of R+1 bits including a least significant bit being set to 1 which is shifted to left whenever the faulty memory cell having the same column address is detected, and the fourth data field may be composed of R bits for indicating the entry location as bit flags, when the memory includes R row redundancies and C column redundancies.

According to another aspect of this invention, there is provided a repair method of a BISR circuit for an embedded memory with multiple redundancies comprising the steps of: filling row/column information to first/second data storing means, respectively, wherein the row/column information include row/column addresses of faulty memory cells, the number of the faulty memory cells having the same row/column addresses, and entry location of opposite data storing means storing column/row addresses corresponding to the respective row/column addresses; determining repair methods of the faulty memory cells as much as the number of row or column redundancies by selecting entry composing the first or the second data storing means in order of the number of the faulty memory cells stored in the entry, and decreasing the number of the faulty memory cells stored in the entry location of the opposite data storing means appointed by the selected entry; and generating repaired addresses to the memory according to the determined repair methods.

In a preferred embodiment, each entry included in the first data storing means comprises: a first data field for indicating validity of the row information stored in the entry; a second data field for storing the row address of the faulty memory cells; a third data field for storing the number of the faulty memory cells having the same row address stored in the second data field; a fourth data field for storing the entry location of the second data storing means storing the column address corresponding to the row address of the faulty memory cells stored in the second data field; and a fifth data field for storing the determined repair method of the faulty memory cells.

Each entry included in the second data storing means preferably comprises a first data field for indicating validity of the column information stored in the entry; a second data field for storing the column address of the faulty memory cells; a third data field for storing the number of the faulty memory cells having the same column address stored in the second data field; a fourth data field for storing the entry location of the first data storing means storing the row address corresponding to the column address of the faulty memory cells stored in the second data field; and a fifth data field for storing determined repair method of the faulty memory cells.

The step for filling row/column information to the first/second data storing means preferably comprises the steps of: determining whether a row address of a faulty memory cell is stored in the first data storing means; if the row address of the faulty memory cell is stored in the first data storing means, increasing the number of faulty memory cells by 1 stored in the third data field of the first data storing means, and storing an entry location of the second data storing means to the fourth data field; if the row address of the faulty memory cell is not stored in the first data storing means, storing the row address to the first data storing means, and storing the entry location of the second data storing means to the fourth data field; determining whether a column address of the faulty memory cell is stored in the second data storing means; if the column address of the faulty memory cell is stored in the second data storing means, increasing the number of faulty memory cells by 1 stored in the third data field of the second data storing means, and storing an entry location of the first data storing means to the fourth data field; and if the column address of the faulty memory cell is not stored in the second data storing means, storing the column address to the second data storing means, and storing the entry location of the first data storing means to the fourth data field.

The step for determining repair methods preferably comprises the steps of: a) selecting either the first data storing means or the second data storing means having fewer entries; (b) determining a repair method of the selected data storing means by selecting the entry in order of the number of the faulty memory cells; (c) decreasing the number of the faulty memory cells stored in the entry location of the opposite data storing means appointed by the selected entry; (d) repeating the (b) and (c) steps as mant times as the number of the row/column redundancies corresponding to the selected data storing means; (e) selecting either the first data storing means or the second data storing means having much entries; and (f) repeating the (b) and (c) steps as much as the number of the row/column redundancies corresponding to the selected data storing means.

The determined repair methods preferably employ the row redundancies and/or the column redundancies. The entry of the opposite data storing means is preferably deleted when the decreased number of faulty memory cells is zero.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 is a diagram for illustrating a structure of conventional fill entries;

FIG. 3A is a diagram for illustrating a structure of row fill entries according to a preferred embodiment of the invention;

FIG. 3B is a diagram for illustrating a structure of column fill entries according to a preferred embodiment of the invention;

FIG. 4A is a diagram for illustrating a structure of one of the row fill entries shown in FIG. 3A;

FIG. 4B is a diagram for illustrating a structure of one of the column fill entries shown in FIG. 3B;

FIGS. 7A–7f are diagrams for illustrating steps for determining repair methods of the faulty memory cells shown in FIG. 5 according to the information stored in the row and column fill entries shown in FIGS. 6A–6J;

DETAILED DESCRIPTION OF PREFERRED EMBODIMENTS

It should be understood that the description of this preferred embodiment is merely illustrative and that it should not be taken in a limiting sense. In the following detailed description, several specific details are set forth in order to provide a thorough understanding of the present invention. It will be apparent, however, to one skilled in the art, that the present invention may be practiced without these specific details.

Figure 1:
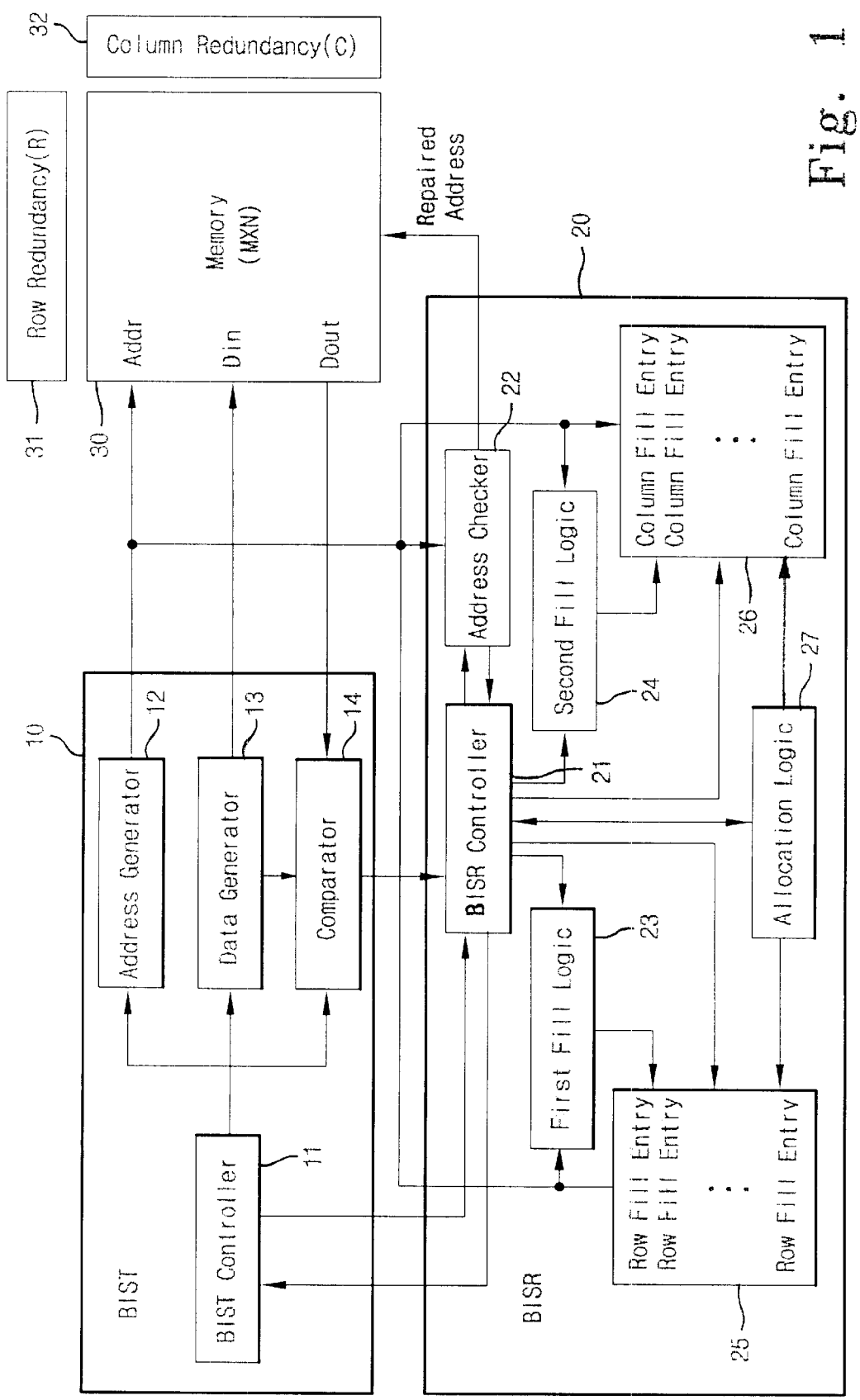
FIG. 1 is a block diagram illustrating an integrated circuit semiconductor device according to a preferred embodiment of the present invention.

FIG. 1 is a block diagram illustrating an integrated circuit semiconductor device according to a preferred embodiment of the present invention. Referring to FIG. 1, the SOC system comprises an embedded memory 30, a BIST circuit 10 for testing the SOC system including the memory 30, and a BISR circuit 20 for repairing the SOC system in response to the tests result from the BIST circuit 10.

The memory 30 is composed of M×N memory cells, and includes a plurality of row redundancies (for example, R redundancies) 31 and a plurality of column redundancies (for example, C redundancies) 32.

The BIST circuit 10 includes a BIST controller 11, an address generator 12, a data generator 13, and a comparator 14. The BISR circuit 20 includes a BISR controller 21, an address checker 22, a first fill logic 23, a second fill logic 24, row fill entries 25, column fill entries 26 and an allocation logic 27. The row and column fill entries 25 and 26 are internal memories comprising a plurality of entries for storing row and column faulty memory cell information occurred in the embedded memory 30. In many cases, the row/column fill entries 25 or 26 are called a failure address memory (FAM). Test and repair operations of the BIST circuit 10 and the BISR circuit 20 for the embedded memory 30 are illustrated as follows.

The BIST controller 11 controls overall BIST operations according to its implemented test algorithms. The address generator 12 generates addresses Addr for transmission to the memory 30. Addresses Addr are composed of row addresses and column addresses. Data generator 13 generates input data Din to be compared with read-out data Dout. The comparator 14 compares the input data Din with the read-out data Dout, and generates faulty memory cell information to the BISR controller 21 of the BISR circuit 20 if there is a mismatch.

The BISR circuit 20 usually operates together with the BIST circuit 10. The BISR controller 21 controls overall BISR operation. It begins operation by receiving the faulty memory cell information from the BIST circuit 10. In a preferred embodiment, when the BISR circuit 20 is in operation, the BIST circuit 10 halts operation and waits pending completion of BISR operation.

When the BIST circuit 10 provides the faulty memory cell information for the BISR controller 21, the first and the second fill logic 23 and 24 store the addresses and the number of the failures to the row fill entries 25 and the column fill entries 26, respectively. The row fill entries 25 and the column fill entries 26 include pointers for appointing entry locations of the opposite entries 26 and 25, respectively, which will be described in detail later. By using the pointers, entry locations of the opposite entries 26 or 25 storing column/row addresses corresponding to the row/column addresses of the faulty memory cells can be verified. The respective pointers are stored by the allocation logic 27.

After storing the faulty memory cell information to the row and column fill entries 25 and 26, completely, the BISR controller 21 selects either the row fill entries 25 or the column fill entries 26. The selected entries have fewer entries compared to the unselected entries. In addition, the BISR controller 21 determines repair methods of the selected row or column fill entries by selecting respective entries in order of the stored number of the faulty memory cells. If the repair methods of the selected fill entries are determined completely, the same procedure is performed for the other fill entries 25 or 26, and vice versa.

When the entry is selected for determining the repair method, the allocation logic 27 decreases the number of the faulty memory cells by 1 stored in the opposite entry appointed by the selected entry, under control of the BIST controller 21. In that case, if the decreased number of the faulty memory cells is zero (i.e., 0), the corresponding entry is deleted by the allocation logic 27. After finishing determining repair methods of the faulty memory cells according to the above described process, the BISR circuit 20 generates and provides repaired addresses to the memory 30 in response to the addresses of the faulty memory cells.

According to the above-mentioned operation of the BISR circuit 20, the faulty memory cells can be repaired in the SOC itself by using the row/column redundancies of the memory 30. The repair method according to the present invention using the row and column entries 25 and 26 provides high repair recovery, regardless of the number of the row/column redundancies 31 or 32.

FIG. 2 is a diagram for illustrating a structure of conventional fill entries. The conventional BISR circuit includes fill entries storing the row and column address information of the faulty memory cells. Generally, the number of the faulty memory cells is 2×R×C to be stored as address information in the fill entries, when the embedded memory includes R row redundancies and C column redundancies. Thus, the number of the fill entries is 2×R×C as shown in FIG. 2. In that case, since a repair algorithm is performed by the row and column addresses of the faulty memory cells stored in the same fill entries, the restrictions to perform the repair algorithm increase proportionally as the number of the faulty memory cells and the redundancies increase.

Referring to FIG. 2, the 'Valid' field indicates the validity of information. The 'Row Address' field is used for storing a row address of the faulty memory cell, and the 'Row Hit Count' field is used for storing the number of the detected faulty memory cells which have the same row address. The 'Column Address' field is used for storing a column address of the faulty memory cell, and the 'Column Hit Count' field is used for storing the number of the detected faulty memory cells which have the same column address. In addition, the 'Row/Column Must' field is set when a row/column is determined to require repair. In that case, it is a problem that the fault recovery of the conventional BISR circuit using the fill entries is decreased in proportion as the number of the faulty memory cells and the number of the row/column redundancies are increased.

Therefore, the BISR circuit 20 (see FIG. 1) according to the present invention constructs the row fill entries and the column fill entries, respectively, by splitting the faulty memory cell information into the row fill entry and the column fill entry to perform the self-repair. Hardware overhead is therefore reduced. In addition, the respective row and column entries store opposite fill entry information, so that the BISR circuit 20 can repair the faulty memory cells exactly, even though the row/column redundancies are increased. The structures of the row and column fill entries 25 and 26 are described as follows.

FIG. 3A is a diagram for illustrating a structure of row fill entries 25 according to a preferred embodiment of the present invention. In the case where the embedded memory 30 includes R row redundancies and C column redundancies, the total number of the row fill entries 25 is R+R×C.

Referring to FIG. 3A, the 'Valid' field is used for indicating validity of information. The 'Row Address' field is used for storing a row address of the faulty memory cell, and the 'Row Hit Count' field is used for storing the number of the faulty memory cells which are detected at the same row address by this time. In that case, if the number of the faulty memory cells having the same row address is greater than the number of the column redundancies (i.e., C) of the memory 30, the value of the 'Row Hit Count' is not increased any more. The 'Column Fill entry Pointer' field is a pointer for indicating a location of a column fill entry storing the column address corresponding to the row address stored in the 'Row Address' field. The 'Column Fill entry Pointer' field is assigned as much as C, corresponding to the number of redundancies. In addition, the 'Row Must' field is set when a row is determined to be repaired with the row redundancy.

FIG. 3B is a diagram for illustrating a structure of column fill entries 26 according to a preferred embodiment of the present invention. In case that the embedded memory 30 includes R row redundancies and C column redundancies, the total number of the column fill entries 26 is C+C×R.

Referring to FIG. 3B, the 'Valid' field is used for indicating validity of information. The 'Column Address' field is used for storing a column address of the faulty memory cell, and the 'Column Hit Count' field is used for storing the number of the faulty memory cells which are detected at the same column address by this time. In that case, if the number of the faulty memory cells having the same column address is greater than the number of the row redundancies (i.e., R) of the memory 30, the value of the 'Column Hit Count' is not increased any more. The 'Row Fill entry Pointer' field is a pointer for indicating a location of a row fill entry storing the row address corresponding to the column address stored in the 'Column Address' field. The 'Row Fill entry Pointer' field is assigned as much as R. In addition, the 'Column Must' field is set when a column is determined to be repaired with the column redundancy.

FIG. 4A is a diagram for illustrating a structure of one the row fill entries 25 shown in FIG. 3A. Referring to FIG. 4A, the size of each field composing the row fill entry 25A is illustrated.

For example, the 'Valid' field is composed of 1 bit. If the embedded memory 30 is composed of M×N memory cells, the 'Row Address' field is composed of $\log_2 M$ bit, the Row Hit Count field is composed of $\lfloor \log_2 C \rfloor + 1$ bits, the 'Column Fill Entry Pointer' field is composed of $\lceil \log_2(C+CR) \rceil$ bit, and the 'Row Must' field is composed of 1 bit. The entry 25A comprises C units of Column Fill Entry Pointer.

FIG. 4B is a diagram for illustrating a structure of one of the column fill entries 26 shown in FIG. 3B. Referring to FIG. 4B, the size of each field composing the column fill entry 26A is illustrated.

For example, the Valid field is composed of 1 bit. If the embedded memory 30 is composed of M×N memory cells, the 'Column Address' field is composed of $\log_2 N$ bits, the 'Column Hit Count' field is composed of $\lfloor \log_2 R \rfloor + 1$ bits, the 'Row Fill Entry Pointer' field is composed of $\lceil \log_2(R+RC) \rceil$ bits, and the 'Column Must' field is composed of 1 bit. The entry 26A comprises R units of 'Row Fill Entry Pointer'.

Besides the above described structure, the 'Column Fill Entry Pointer' may be composed of C bits corresponding to the number of the column redundancies of the embedded memory 30, and the 'Row Fill Entry Pointer' may be composed of R bits corresponding to the number of the row redundancies of the embedded memory 30. The 'Row Fill Entry Pointer' or the 'Column Fill Entry Pointer' is used as a bit flag to indicate location of the opposite entry storing row/column address of the faulty memory cell. In that case, each bit of the 'Row Fill Entry Pointer' and the 'Column Fill Entry Pointer' illustrates where the row or the column address corresponding to the column or row address of the current entry is stored in the opposite entry. The entry location can be verified by searching which bit is set to 1 among the bits of the 'Row Fill Entry Pointer' or the 'Column Fill Entry Pointer'.

In addition, the 'Row Hit Count' and the 'Column Hit Count' may be composed of 'the number of opposite redundancies+1' bits, and the least significant bits (LSBs) of the 'Row Hit Count' and 'Column Hit Count' are set to 1, respectively. For example, the 'Row Hit Count' is composed of C+1 bits and the 'Column Hit Count' is composed of R+1 bits. In that case, the bit marked to 1 is shifted left whenever a faulty memory cell is detected at the same row or column address. For example, if any faulty memory cell is not detected at the same row or column address, the LSB of the 'Row Hit Count' or the 'Column Hit Count' maintains the value of 1. However, if any faulty memory cell is detected at the same row or column address, the bit marked to 1 is shifted as much as the number of the faulty memory cells occurred at the same address. Thus, the number of the faulty memory cells having the same address can be verified by the location of the bit marked to 1.

Figure 5:
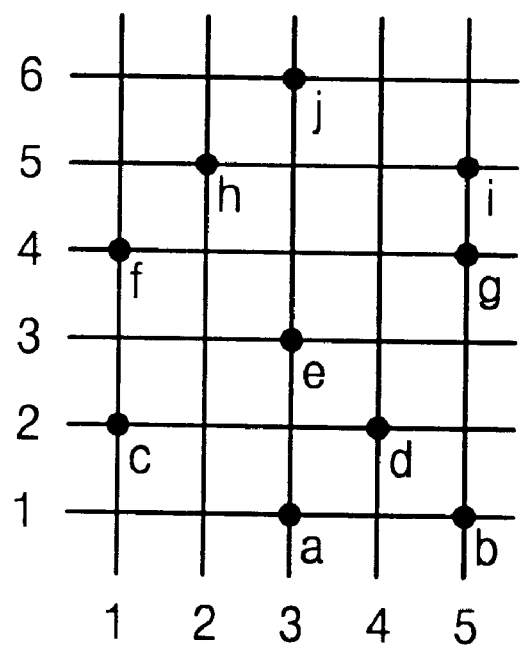
FIG. 5 is a diagram for illustrating an example of faulty memory cells occurring in the embedded memory shown in FIG. 1.

FIG. 5 is a diagram for illustrating an example of a faulty memory cell distribution occurred in the embedded memory 30 shown in FIG. 1. Referring to FIG. 5, each character a–j illustrates detection order of the faulty memory cells. For example, if the number of the row redundancies is 3 (i.e., R=3) and the number of the column redundancies is 2 (i.e., C=2), the repair methods of the faulty memory cells according to the present invention is described as follows.

FIGS. 6A to 6J are diagrams for illustrating steps for storing information related to the faulty memory cells a–j shown in FIG. 5 to the row and column fill entries 25 and 26 shown in FIGS. 3A and 3B.

Figure 6A:
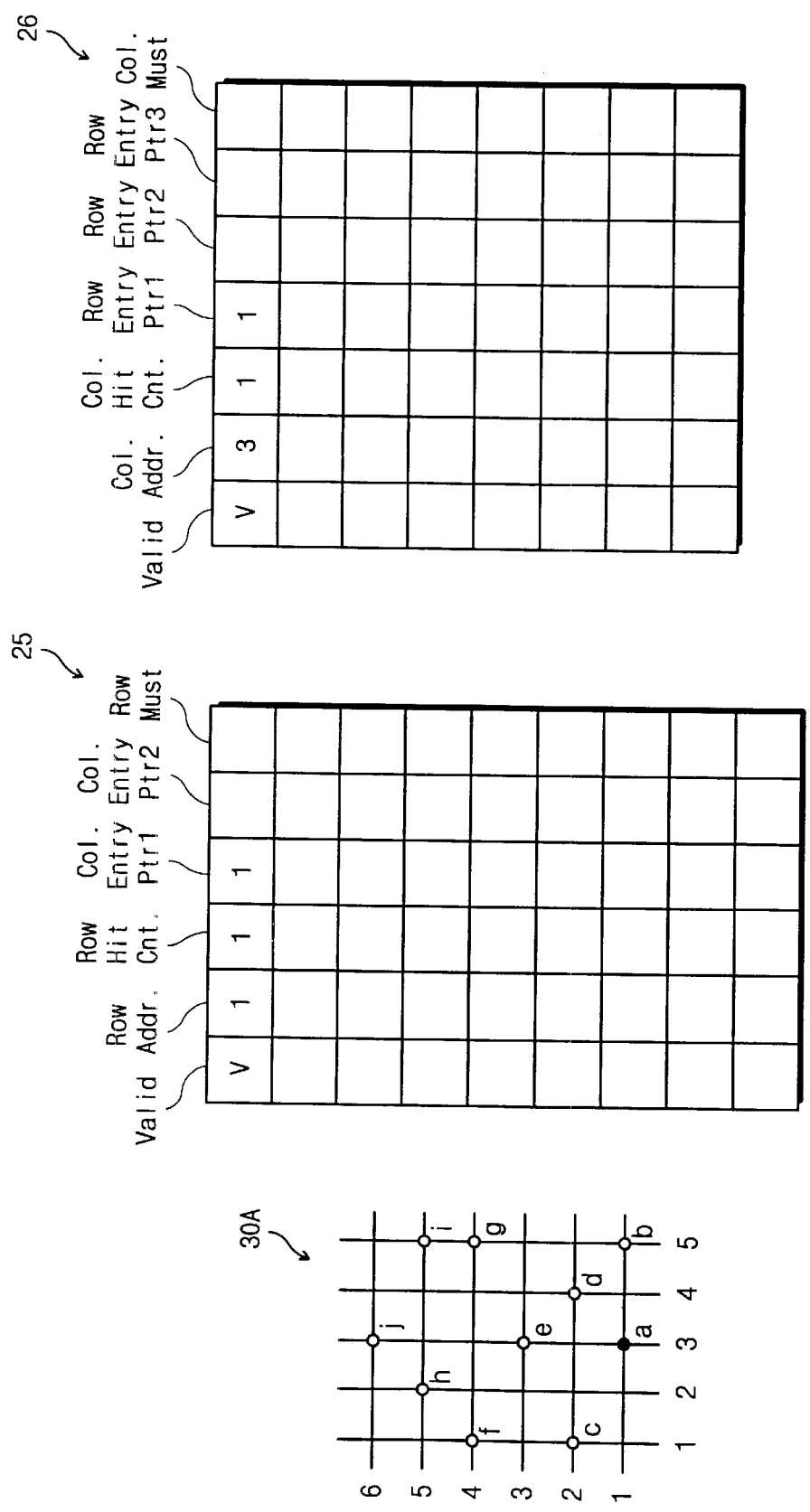
FIGS. 6A–6J are diagrams for illustrating a process for storing information related to the faulty memory cells shown in FIG. 5 to the row and column fill entries shown in FIGS. 3A and 3B.

Referring first to FIG. 6A, since the number of the row redundancies included in the memory 30A is 3 (i.e., R=3) and the number of the column redundancies included in the memory 30A is 2 (i.e., C=2), the row fill entries 25 is composed of 9 (i.e., 3+3×2=9) entries and the column fill entries 26 is composed of 8 (i.e., 2+2×3=8) entries. In that case, the 'Column Fill Entry Pointer' fields is assigned to 2, as much as the number of the column redundancies (i.e., C=2), such as Col. Entry Ptr1 and Col. Entry Ptr2. In addition, the 'Row Fill Entry Pointer' fields is assigned to 3, as much as the number of the row redundancies (i.e., R=3), such as Row Entry Ptr1, Row Entry Ptr2 and Row Entry Ptr3. In FIGS. 6A to 6J, a black circle illustrates detected faulty memory cell, and a white circle illustrates undetected faulty memory cell.

Referring to the row fill entries 25 of FIG. 6A, when a first faulty memory cell 'a' is detected, it is determined whether the row address of the first faulty memory cell 'a' is stored in the row fill entries 25. In that case, the row address (i.e., 1) is not yet stored in the row fill entries 25, so that the first entry becomes valid and the row address of the first faulty memory cell 'a' is stored to the 'Row Address' (i.e., Row Addr.) field. Until now, the number of the detected faulty memory cell at the first row is 1, so that the 'Row Hit Count' (i.e., Row Hit Cnt) field is filled to 1. The column address (i.e., 3) of the first faulty memory cell 'a' will be stored to a first entry of the column fill entries 26. Thus, the first 'Column Fill Entry Pointer' (i.e., Col. Entry Ptr. 1) field is filled to 1.

Continually referring to the column fill entries 26 of FIG. 6A, after storing row information of the first faulty memory cell 'a', it is determined whether the column address of the first faulty memory cell 'a' is stored in the column fill entries 26. In that case, the column address (i.e., 3) is not stored in the column fill entries 26, so that the first entry becomes valid and the column address (i.e., 3) is stored to the 'Column Address' (i.e., Col. Addr.) field. Until now, the number of the detected faulty memory cell at the third column is 1, so that the 'Column Hit Count' (i.e., Col. Hit Cnt) field is filled to 1. The row address of the first faulty memory cell 'a' is stored in the first entry of the row fill entries 25. Thus, first 'Row Fill Entry Pointer' (i.e., Row Entry Ptr. 1) field is filled to 1.

Figure 6B:
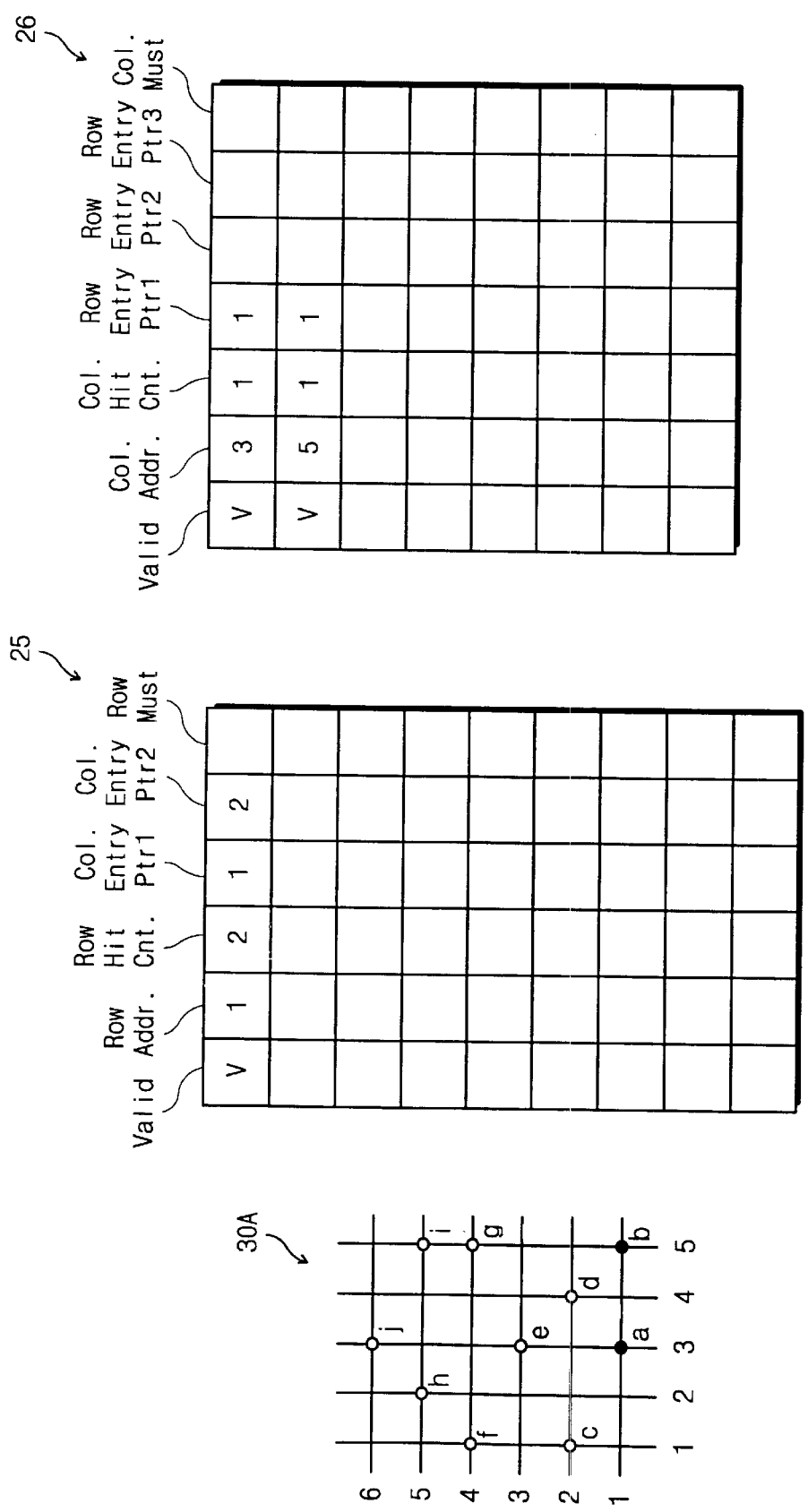
Figure 6C:
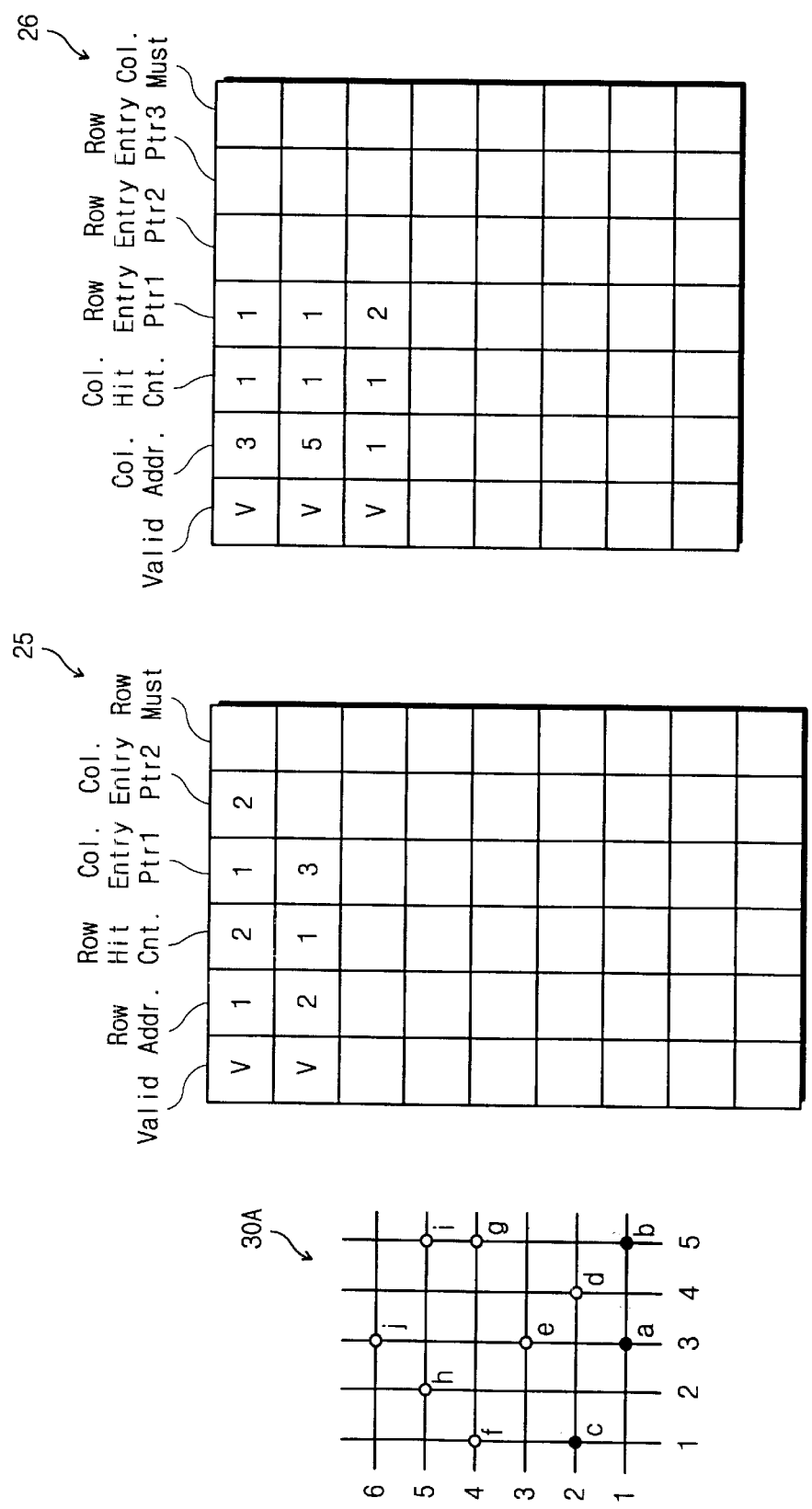
Figure 6D:
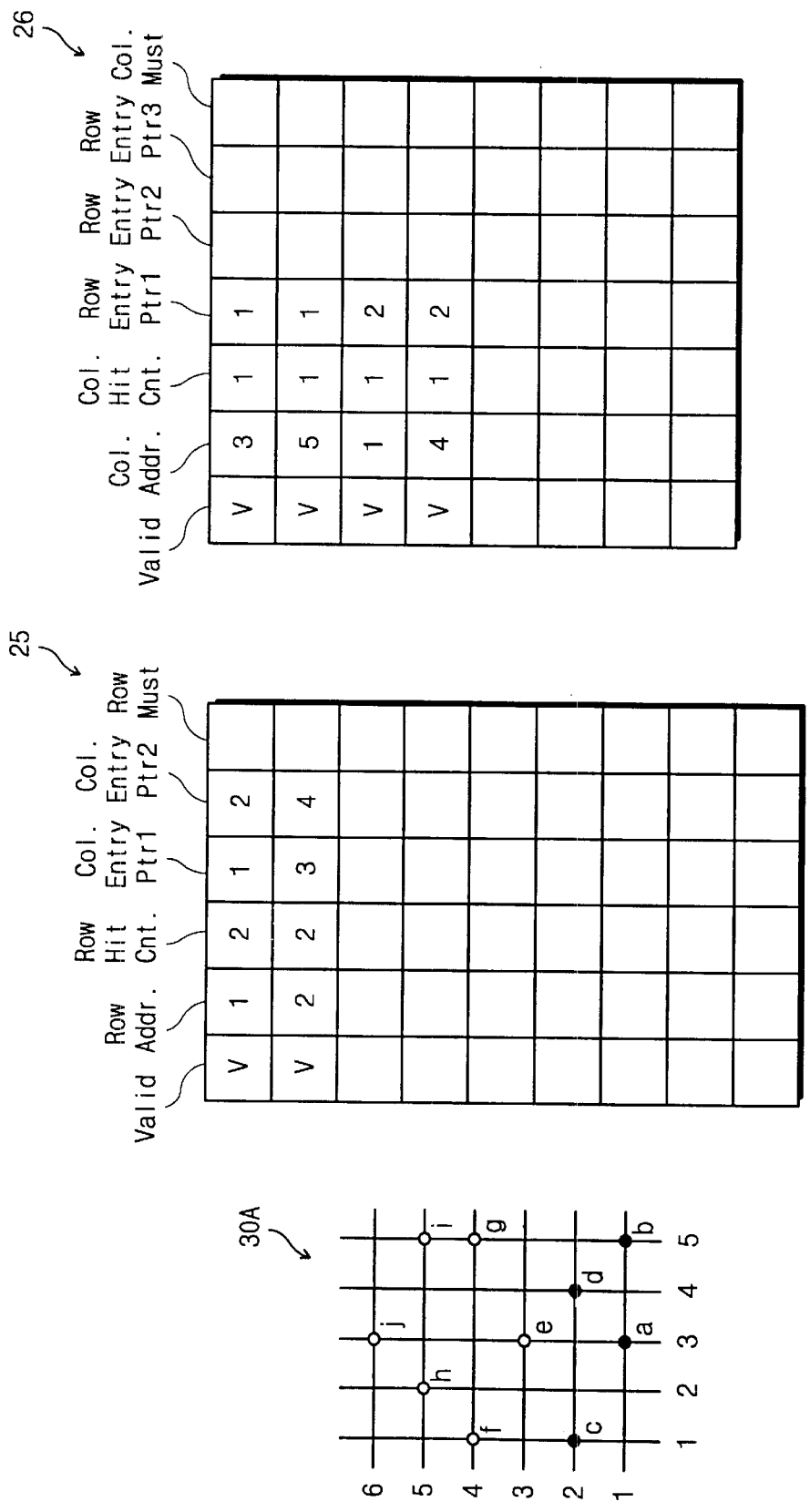
Figure 6E:
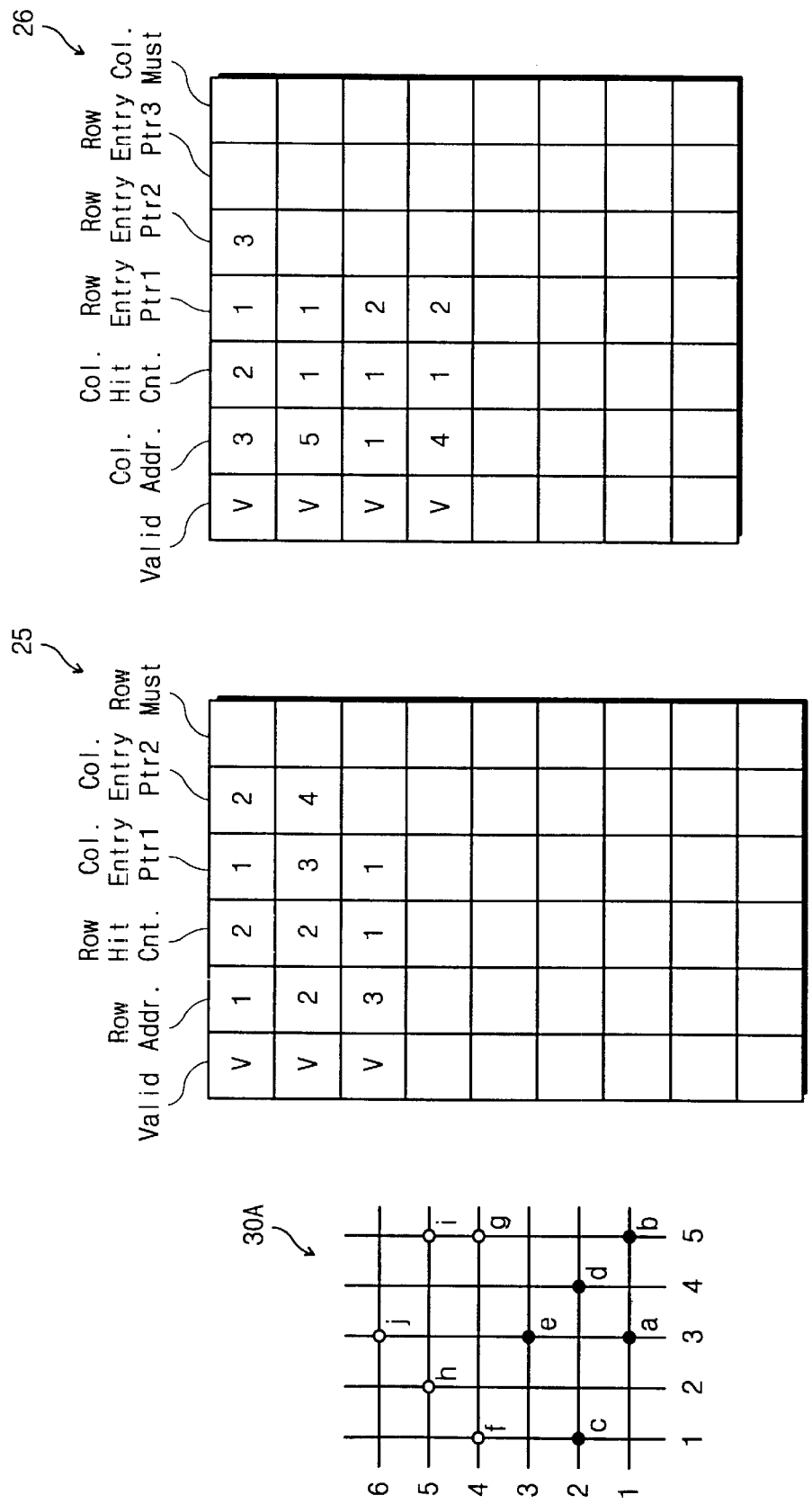
Figure 6F:
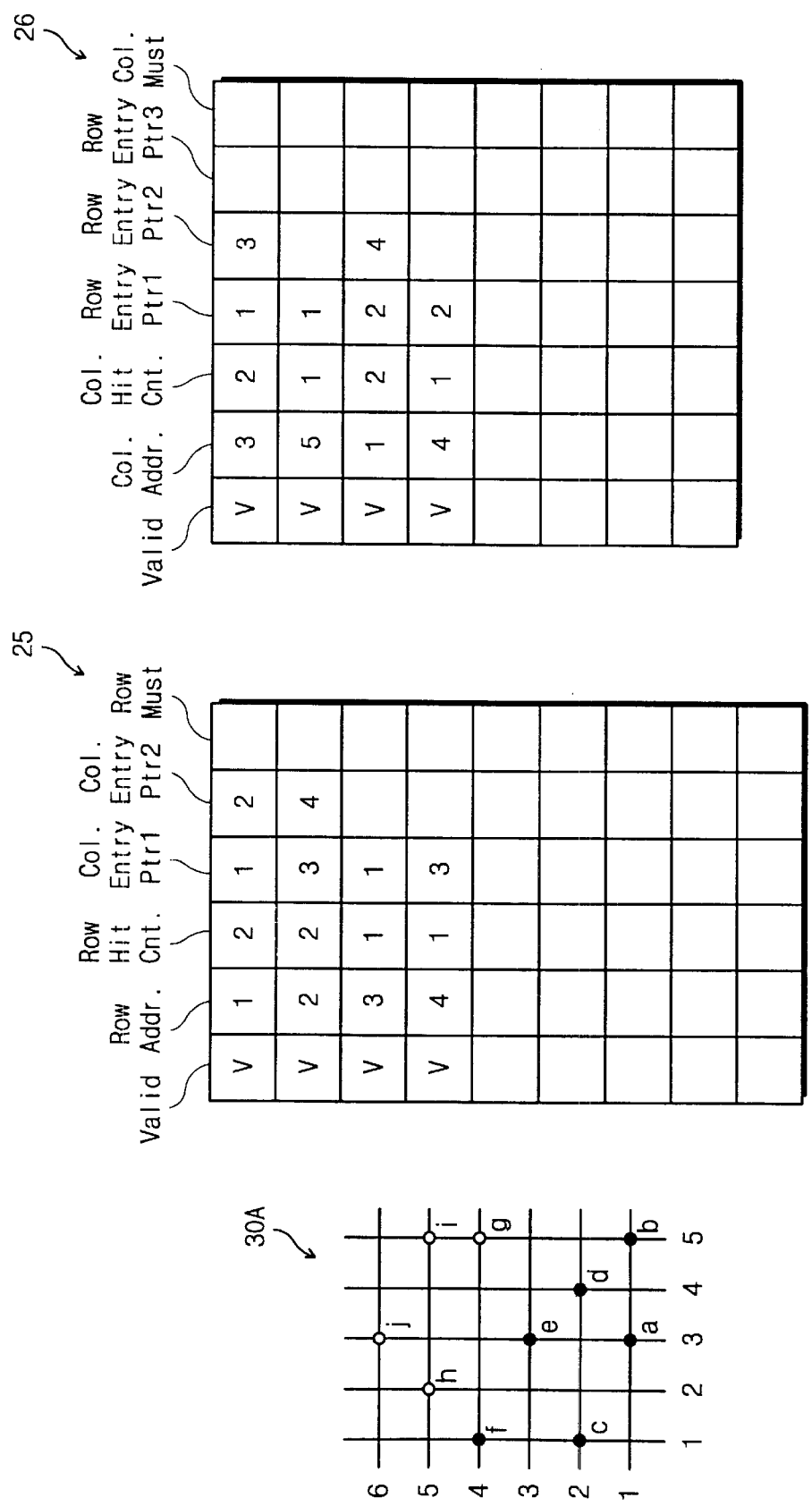
Figure 6G:
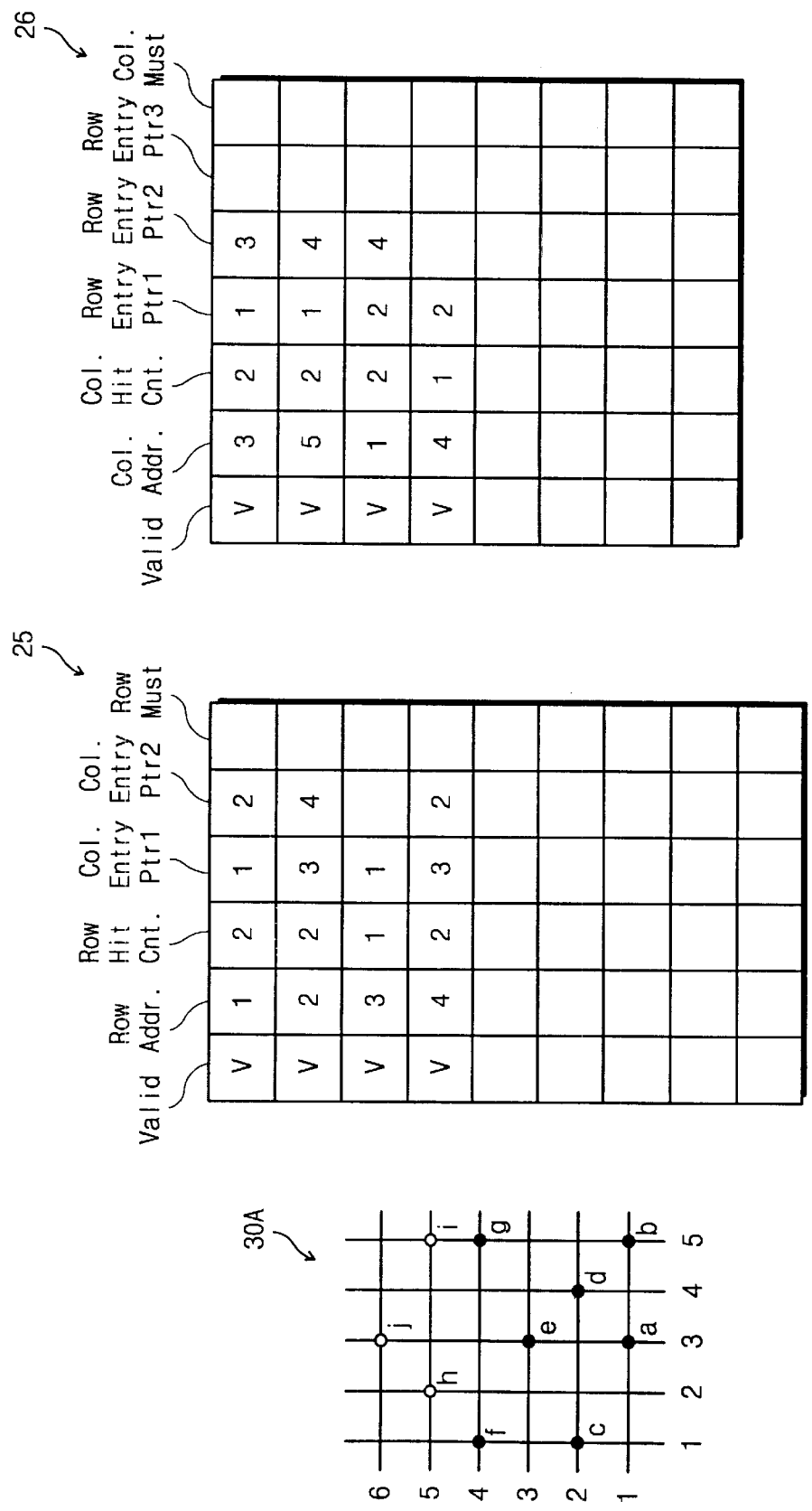
Figure 6H:
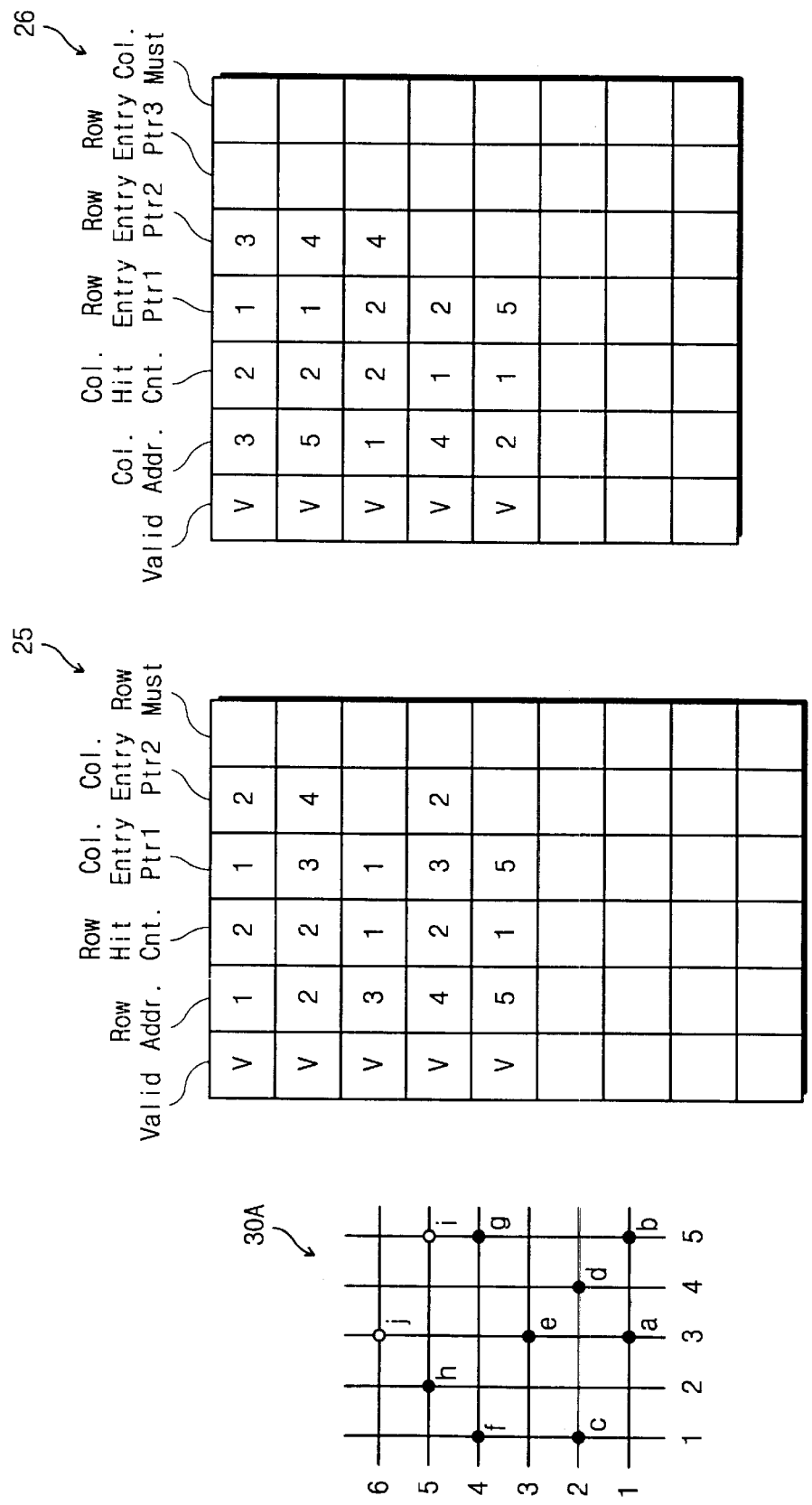
Figure 6I:
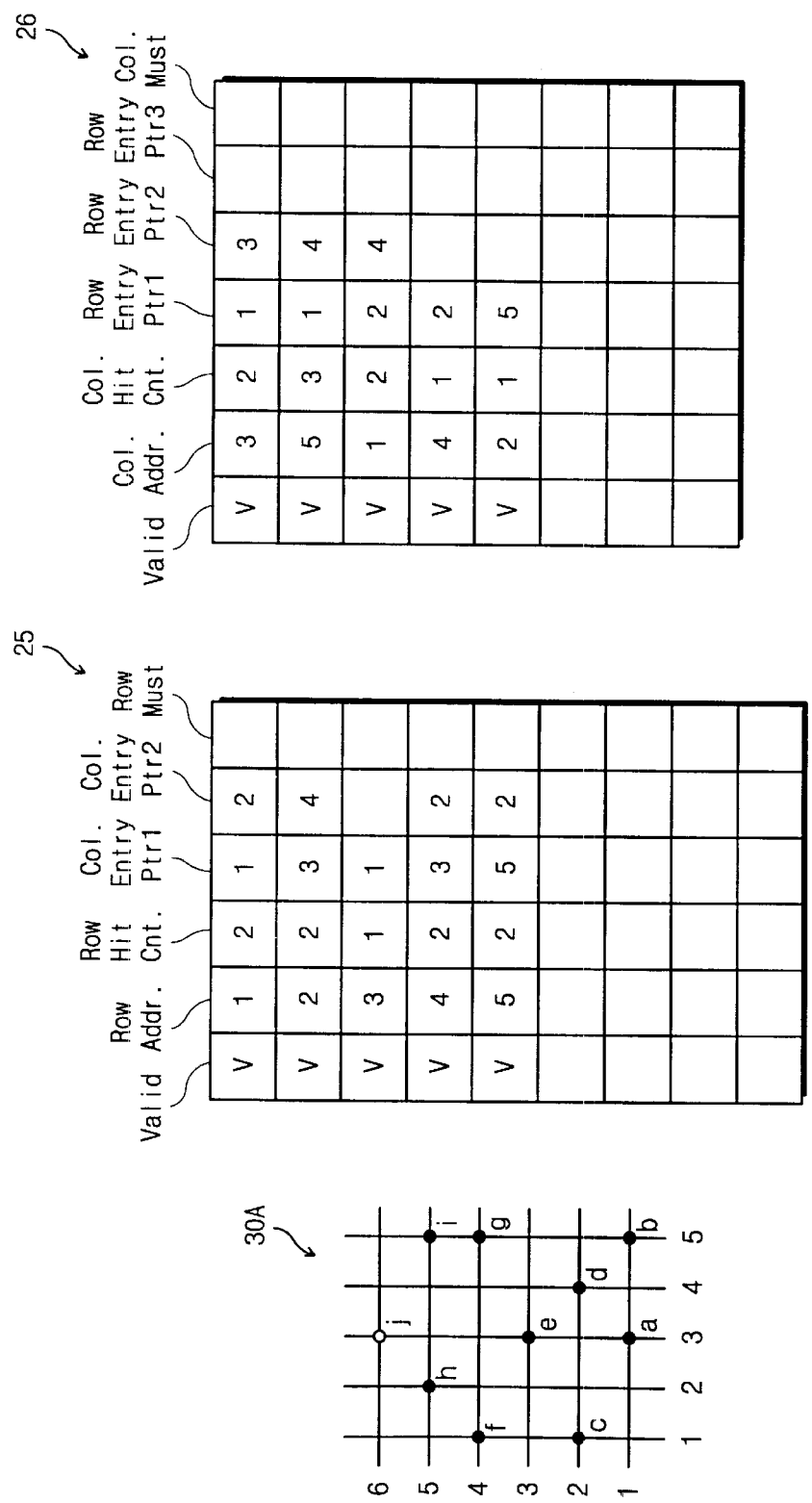

Referring to the row fill entries 25 of FIG. 6B, when a second faulty memory cell b is detected after detecting the first faulty memory cell 'a', it is determined whether the row address of the second faulty memory cell 'b' is stored in the row fill entries 25. In that case, the row address (i.e., 1) is stored already in the first entry of the row fill entries 25, so that the 'Row Address' (i.e., Row Addr.) field is not changed and the 'Row Hit Count' (i.e., Row Hit Cnt) value is updated to 2. The column address of the second faulty memory cell 'b' will be stored to a second entry of the column fill entries 26. Thus, the second 'Column Fill Entry Pointer' (i.e., Col. Entry Ptr. 2) field is filled to 2.

Continually referring to the column fill entries 26 of FIG. 6B, after storing row information of the first faulty memory cell 'b', it is determined whether the column address (i.e., 5) of the second faulty memory cell 'b' is stored in the column fill entries 26. In that case, the column address (i.e., 5) is not stored in the column fill entries 26. Thus, a second entry of the column fill entries 26 becomes valid and the column address (i.e., 5) is stored to the 'Column Address' (i.e., Col. Addr.) field of the second entry. Until now, the number of the detected faulty memory cell at the fifth column is 1, so that the 'Column Hit Count' (i.e., Col. Hit Cnt) field is filled to 1. The row address of the second faulty memory cell 'b' is stored in the first entry of the row fill entries 25. Thus, first 'Row Fill Entry Pointer' (i.e., Row Entry Ptr. 1) field is filled to 1.

However, when the number of the row redundancies is 3 (i.e., R=3) and the number of the colimn redundancies is 2 (i.e., C=2), if more than three faulty memory cells are detected at a row (i.e., if the 'Row Hit Count' value exceeds the number of the column redundancies), the faulty memory cells must be repaired with the row redundancy, because the number of the faulty memory cells exceeds a repair range of the column redundancy. In other words, if the number of the faulty memory cells exceed the number of the column redundancies at a certain row, the 'Row Must' field must be set to 1. At this time, respective 'Column Hit Count' values of the column fill entries 26 storing column addresses corresponding to the row address, are decreased by 1. In addition, the 'Column Fill Entry pointers' of the row fill entries 25 are deleted, and then error check of the next row is performed. As described operations are illustrated taking example of the row fill entries 25. However, the same procedure is performed for the column fill entries 26 as the row fill entries 25.

Figure 6J:
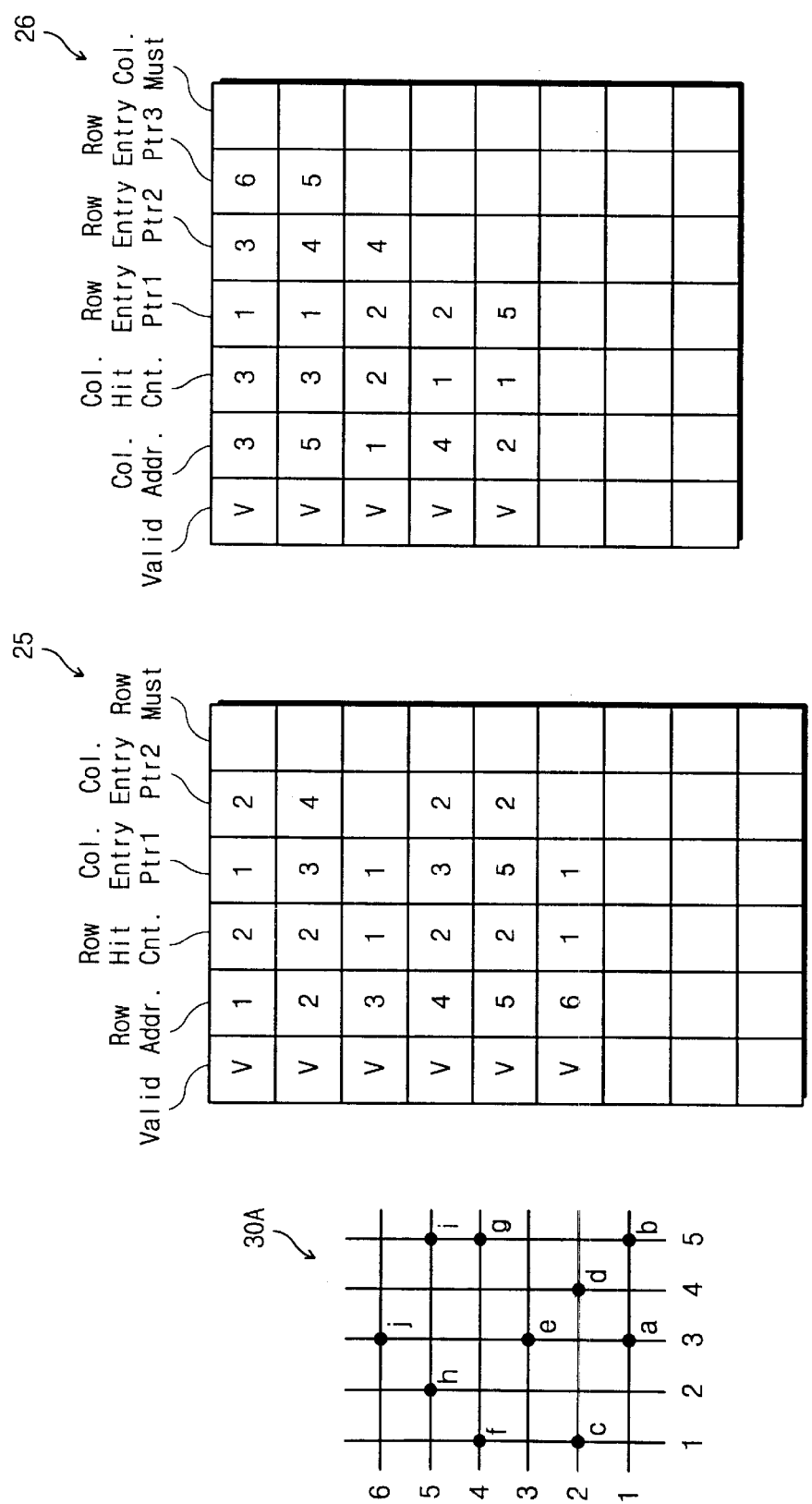

If the steps for storing information related to the faulty memory cells are repeated as shown in FIGS. 6C to 6J, the row and column fill entries 25 and 26 storing information of whole faulty memory cells can be obtained as shown in FIG. 6J. After completing storing faulty memory cell information to the row and column fill entries 25 and 26, the BISR circuit 20 according to the present invention determines repair methods of the faulty memory cells by using the stored information and repairs the faulty memory cells through the determined repair methods. The steps for determining repair method of the faulty memory cells according to the present invention are illustrated as follows.

FIGS. 7A–7F are diagrams for illustrating steps for determining repair methods of the faulty memory cells a–j shown in FIG. 5 according to the information stored in the row and column fill entries 25 and 26 shown in FIGS. 6A–6J. The BISR circuit 20 according to the present invention decreases the number of the faulty memory cells stored in opposite fill entries during determining the repair methods of the faulty memory cells a–j stored in row/column fill entries 25 or 26. After completing determination of the repair methods, the faulty memory cells a–j are repaired by the information stored in the row and column fill entries 25 and 26. After repairing, the BISR circuit 20 generates repaired addresses to the embedded memory 30.

For determining repair methods, the row and column fill entries 25 and 26 are classified into major entries and minor entries by the number of the row and column redundancies equipped in the memory 30. For example, if the number of the row redundancies is 3 (i.e., R=3) and the number of the column redundancies is 2 (i.e., C=2), the row fill entries 25 are appointed to the major entries and the column fill entries 26 are appointed to the minor entries, respectively. To reduce processing time, minor entries are selected first.

Referring to FIG. 7A, a first entry of the column fill entries 26 defined as the minor entries is selected, since the first entry contains the highest 'Column Hit Count' value (refer to circle) indicating the number of the faulty memory cells. The faulty memory cell corresponding to the column address (i.e., 3) stored in the selected first column fill entry is determined to repair with the column redundancy. The row addresses of the faulty memory cell corresponding to the column address (i.e., 3) are stored in Row Entry Ptr1, Row Entry Ptr2, and Row Entry Ptr3 field, respectively. Referring to the column fill entries 26 of FIGS. 7A, 1, 3, and 6 are stored in Row Entry Ptr1, Row Entry Ptr2, and Row Entry Ptr3 fields, respectively. It means that the row addresses of the faulty memory cells corresponding to the column address (i.e., 3) are stored in the first, third and sixth row fill entries, respectively (refer to arrows).

As described above, since the first entry of the column fill entries 26 is repaired with the column redundancy, the 'Column Must' (i.e., Col. Must) field is set to 1, and the values stored in the Row Entry Ptr1, Row Entry Ptr2, and Row Entry Ptr3 fields are deleted. In addition, the 'Row Hit Count' (i.e., Row Hit Cnt.) values stored in the first, third and sixth row fill entries are decreased by 1, respectively. In that case, if the deleted 'Row Hit Count' value is zero (i.e., 0), the entry is deleted.

For example, the 'Row Hit Count' value stored in the first row fill entry becomes 1, and the 'Row Hit Count' value stored in the third and the sixth row fill entries becomes 0, respectively. Thus, both the third and the sixth row fill entries are deleted. The result of the described process is illustrated in FIG. 7B.

Figure 7B:
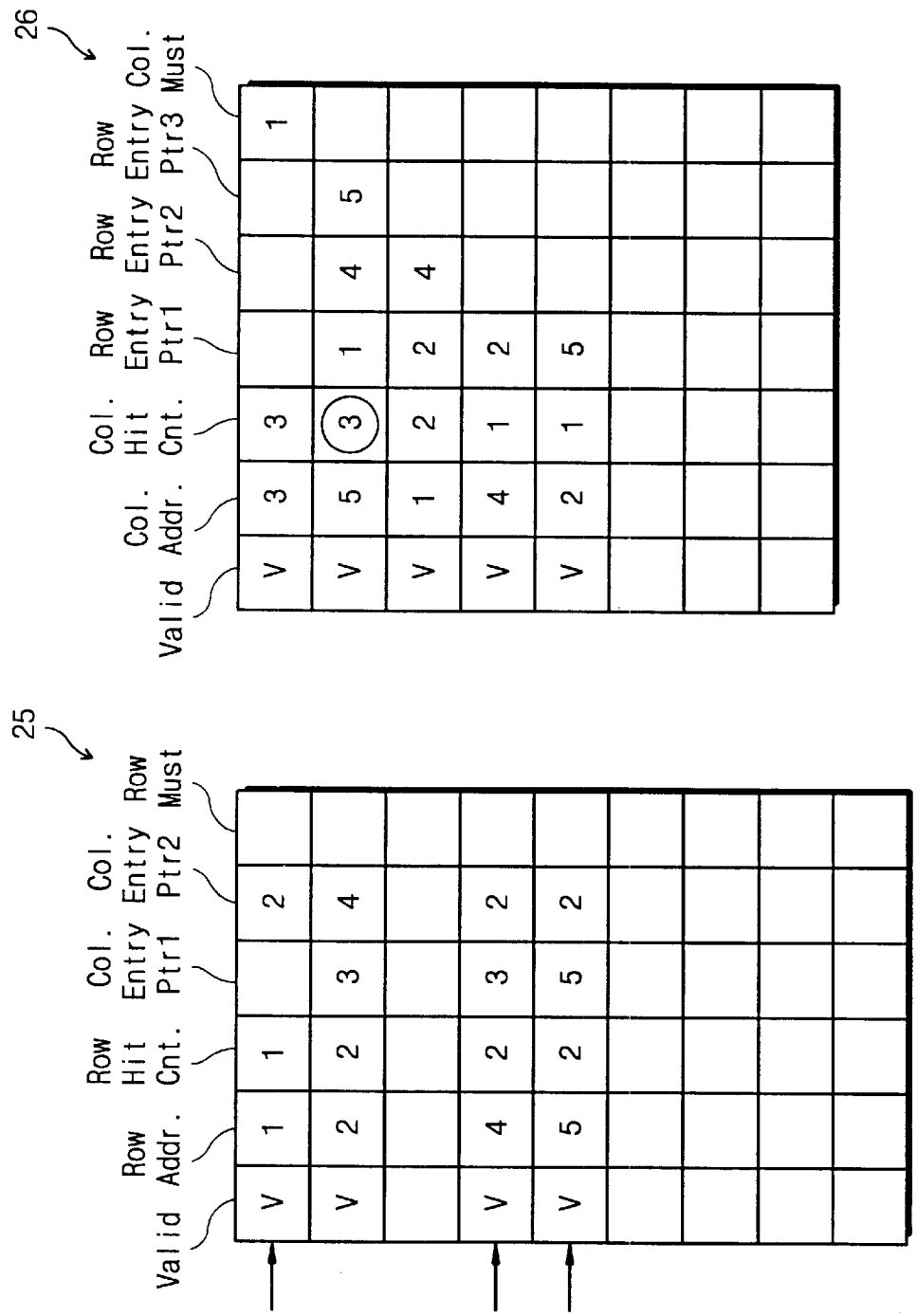

Referring to FIG. 7B, a second column fill entry is selected, since the second entry contains the highest 'Column Hit Count' value (refer to circle) among the column fill entries 26 being not determined the repair method. The faulty memory cell corresponding to the column address (i.e., 5) stored in the selected column fill entry is determined to repair with the column redundancy. The row addresses of the faulty memory cell corresponding to the column address (i.e., 5) are stored in Row Entry Ptr1, Row Entry Ptr2, and Row Entry Ptr3 field, respectively. Referring to the column fill entries 26 of FIGS. 7B, 1, 4, and 5 are stored in Row Entry Ptr1, Row Entry Ptr2, and Row Entry Ptr3 fields, respectively. It means that the row addresses of the faulty memory cells corresponding to the column address (i.e., 5) are stored in the first, fourth and fifth row fill entries, respectively (refer to arrows).

Since the second entry of the column fill entries 26 is repaired with the column redundancy, the 'Column Must' (i.e., Col. Must) field is set to 1, and the values stored in the Row Entry Ptr1, Row Entry Ptr2, and Row Entry Ptr3 fields are deleted. In addition, the 'Row Hit Count' (i.e., Row Hit Cnt.) values stored in the first, fourth and fifth row fill entries are decreased by 1, respectively.

For example, the 'Row Hit Count' value stored in the first row fill entry becomes 0, and the 'Row Hit Count' values stored in the fourth and the fifth row fill entries becomes 1, respectively. Thus, the first row fill entry is deleted. The result of the described process is illustrated in FIG. 7C.

Referring to FIG. 7C, the repair methods of the minor entries (i.e., column entries 26) are determined as much as two column redundancies. After determining repair methods of the minor entries, the repair methods of the major entries using the row redundancies are determined as much as the number of the row redundancies.

First of all, a second entry of the row fill entries 25 defined as the major entry is selected, since the second entry contains the highest 'Row Hit Count' value (refer to circle) indicating the number of the faulty memory cells. The faulty memory cell corresponding to the row address (i.e., 2) of the selected row fill entry is determined to repair with the row redundancy. The column address of the faulty memory cell corresponding to the row address is stored in Col. Entry Ptr1 and Col. Entry Ptr2 field, respectively. Referring to FIGS. 7C, 3, and 4 are stored in Col. Entry Ptr1 and Col. Entry Ptr2 fields, respectively. It means that the column addresses of the faulty memory cells corresponding to the row address (i.e., 2) are stored in the third and fourth column fill entries, respectively (refer to arrows).

Since the second entry of the row fill entries 25 is repaired with the row redundancy, the 'Row Must' field is set to 1, and the values stored in the Col. Entry Ptr1 and Col. Entry Ptr2 fields are deleted. In addition, the 'Column Hit Count' (i.e., Col. Hit Cnt.) values stored in the third and fourth column fill entries are decreased by 1, respectively. In that case, if the deleted 'Col. Hit Count' value is zero (i.e., 0), the entry is deleted.

For example, the 'Col. Hit Count' value stored in the third column fill entry becomes 1, and the 'Col. Hit Count' value stored in the fourth row fill entry becomes 0. Thus, the fourth row fill entry is deleted. The result of the described process is illustrated in FIG. 7D.

If the above-mentioned steps for determining repair methods of faulty memory cells are repeated as shown in FIGS. 7D to 7E, the repair methods of whole faulty memory cells can be obtained as shown in FIG. 7F.

Referring to FIG. 7F, the faulty memory cell information to be repaired remains in the row and column fill entries 25 and 26, respectively. The remaining information corresponds to the number of the row and column redundancies. The faulty memory cells appointed by the row fill entries 25 are repaired using the row redundancies, and the faulty memory cells appointed by the column fill entries 26 are repaired using the column redundancies, respectively. At this time, if a valid entry being not determined repair method exists in the row fill entries 25 or the column fill entries 26, the faulty memory cell corresponding to the entry is determined as an unrepairable faulty memory cell.

For example, if the faulty memory cells are distributed symmetrically in every direction on the basis of a specific cell, the faulty memory cells are unrepairable. According to the present invention, these cells are determined repairable or unrepairable by location of the cells. However, frequency in occurrence of such distribution of the faulty memory cells is very low. Thus, the BISR circuit according to the present invention and the repair method of the same can repair most faulty memory cells. In addition, the BISR circuit and the repair method have high repair coverage.

Figure 8:
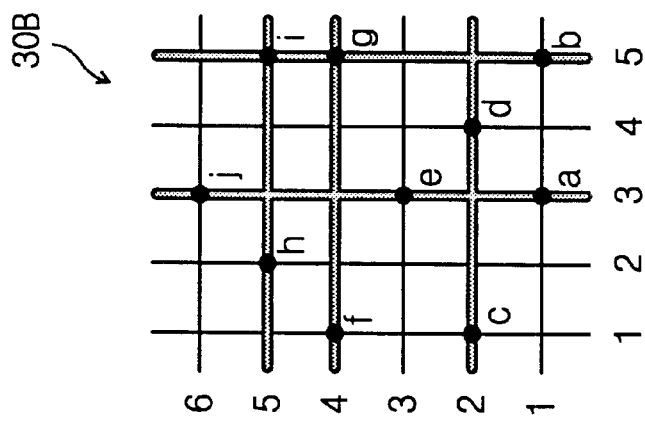
FIG. 8 is a diagram for illustrating a repaired result of the embedded memory according to the repair methods determined by the steps shown in FIGS. 7A–7F.
Figure 8:
Figure 8:
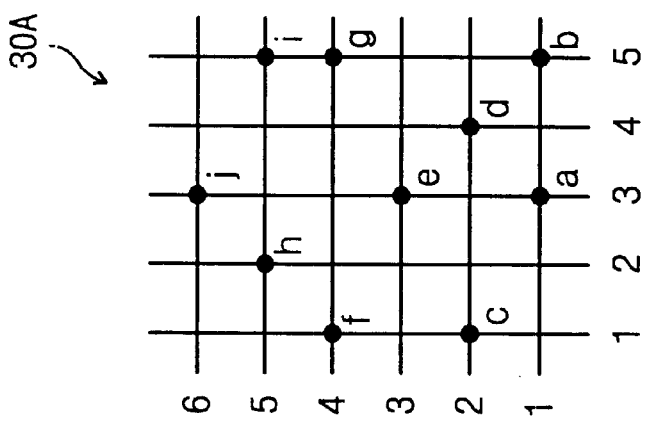

FIG. 8 is a diagram for illustrating a repaired result of the embedded memory shown in FIG. 1 according to the repair methods determined by the steps shown in FIGS. 7A to 7F. Referring to FIG. 8, the embedded memory 30A including faulty memory cells a–j can be repaired by the row and the column redundancies of the memory 30A. The repaired result of the memory is illustrated as a memory 30B shown in FIG. 8.

Figure 9:
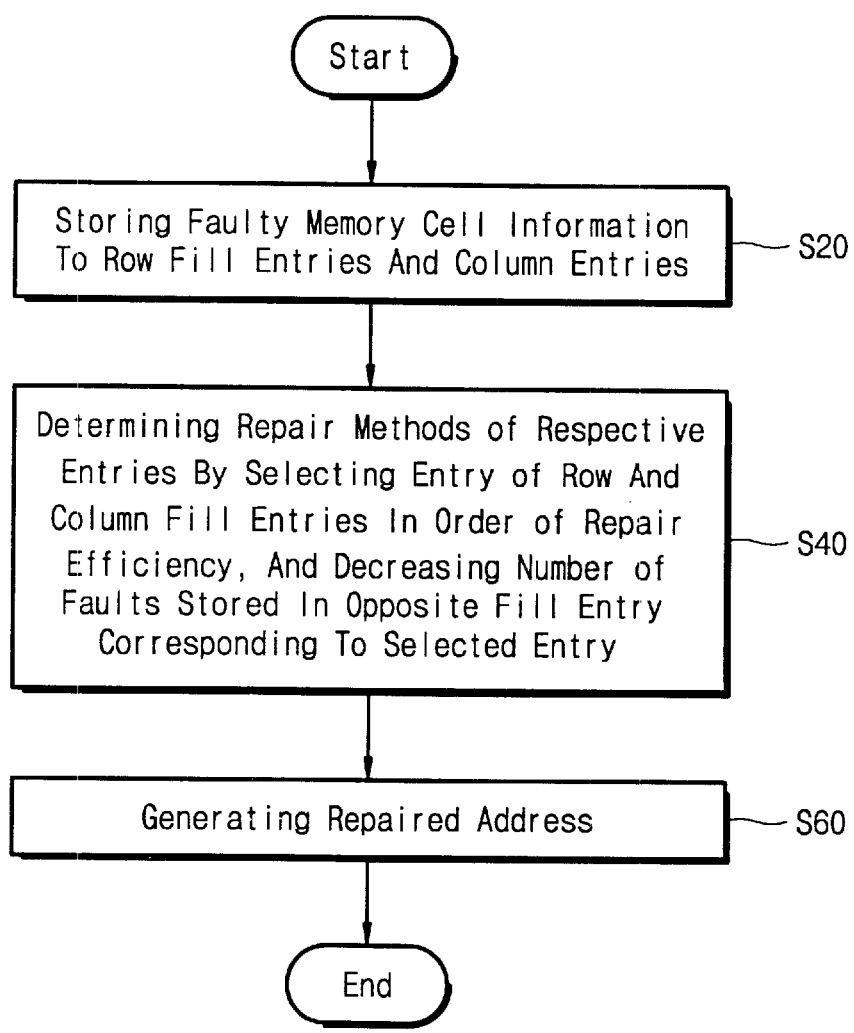
FIG. 9 is a schematic flowchart for illustrating an operation of the BISR circuit shown FIG. 1.

FIG. 9 is a flow diagram for illustrating an operation of the BISR circuit 20 shown in FIG. 1. Referring to FIG. 9, at step S20, the BISR circuit 20 according to the present invention stores faulty memory cell information to the row fill entries 25 and the column fill entries 26, respectively. At step S40, repair methods of respective entries are determined by selecting entry of the row fill entries 25 and the column fill entries 26 in order of repair efficiency, and the number of faults stored in the opposite fill entry corresponding to the selected entry is decreased by 1. Thus, information to be repaired can be remained in the row and column fill entries 25 and 26. In that case, the repair efficiency is increased when an entry storing a large number of faults is selected. Continually, at step S60, the BISR circuit 20 generates repaired addresses to the memory 30 through logical repair of the faulty memory cells.

Figure 10A:
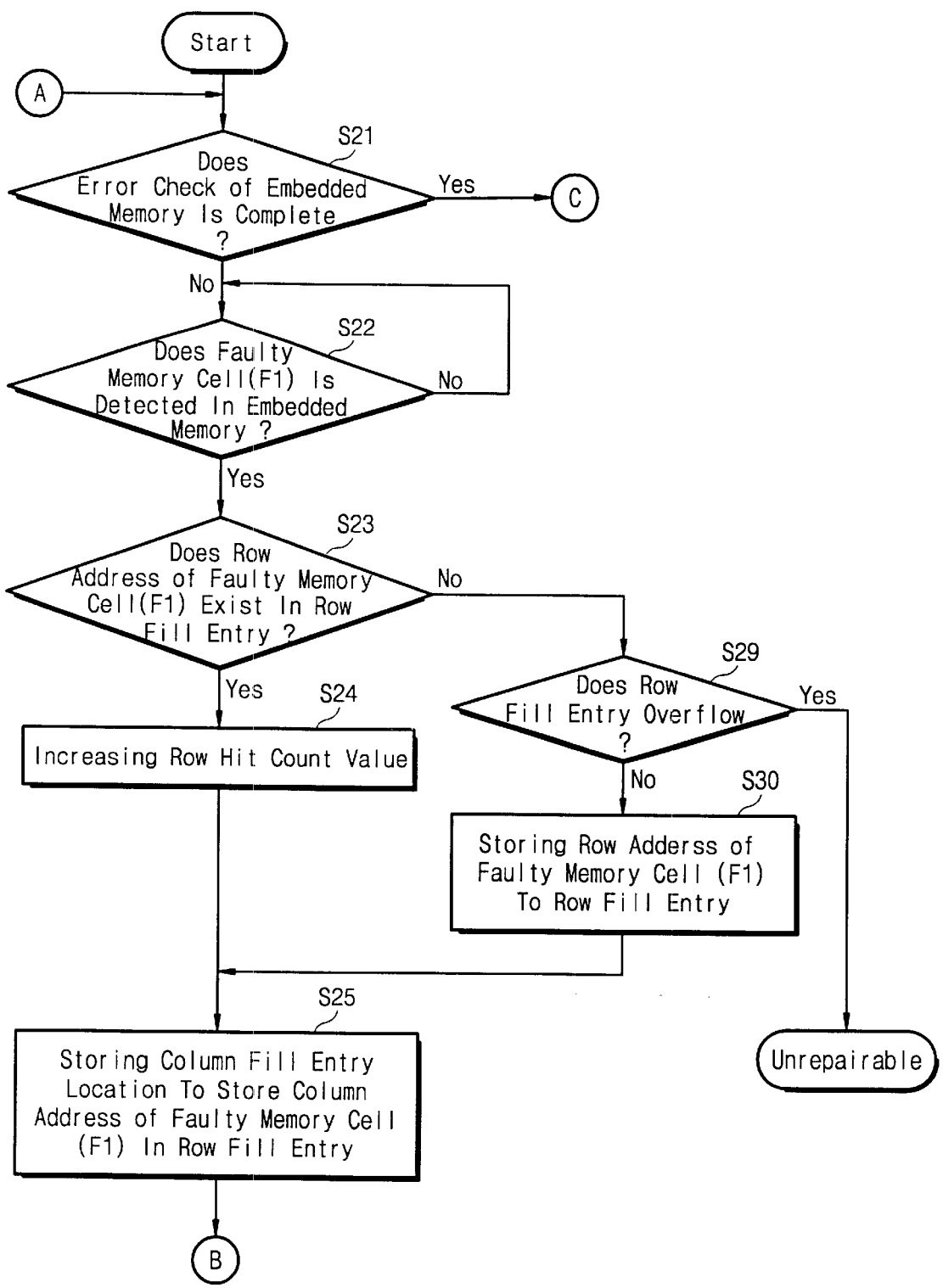
FIGS. 10A and 10B are detailed flowcharts for illustrating the step for storing faulty memory cell information to the row and column fill entries shown in FIGS. 3A and 3B.
Figure 10B:
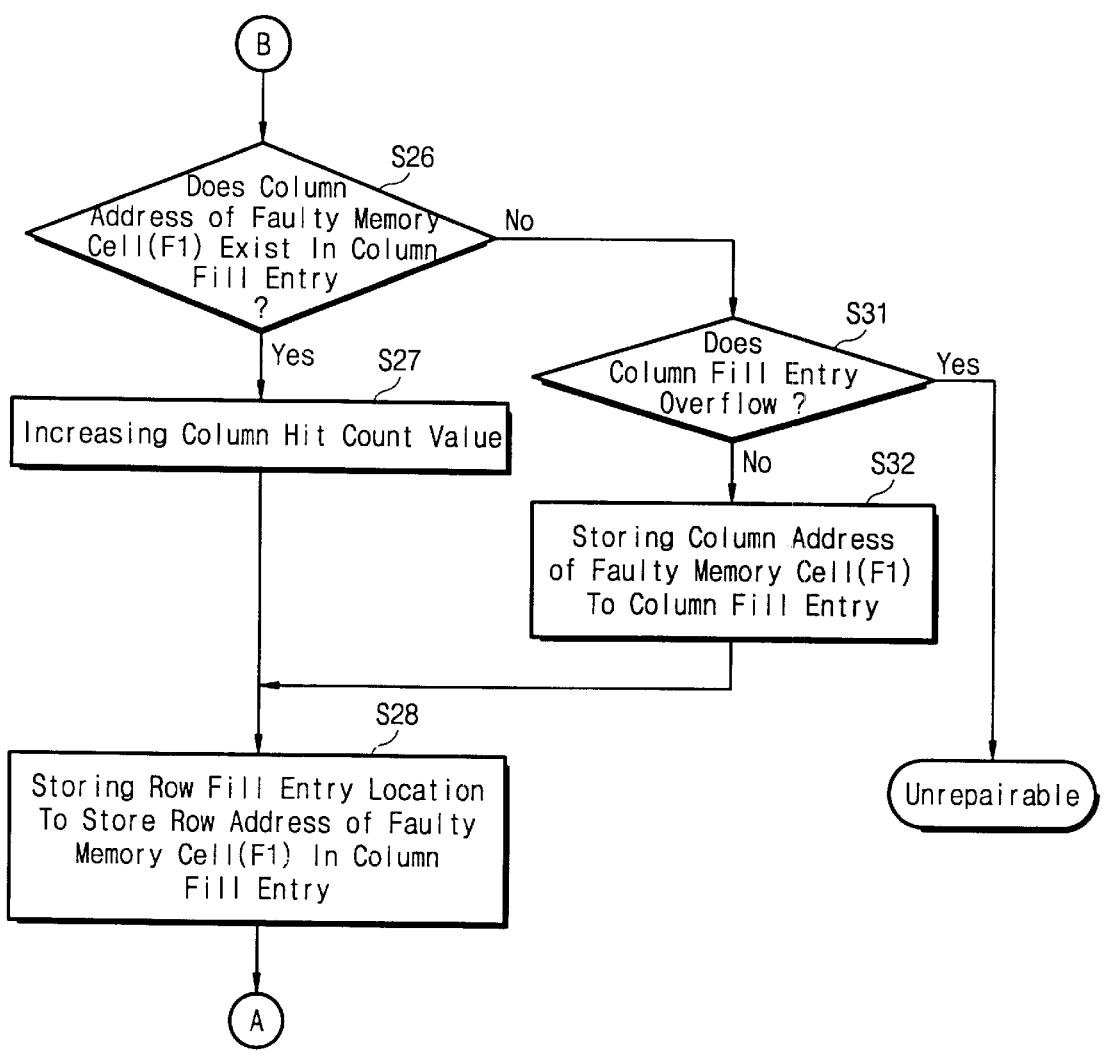

FIGS. 10A and 10B are detailed flowcharts for illustrating the step for storing faulty memory cell information to the row fill entries 25 and the column fill entries 26 shown in FIG. 9. Referring to FIG. 10A, at step S21, it is determined whether error check of the embedded memory 30 is complete. If so, the flow proceeds to step S41 of FIG. 11A. If not, the flow proceeds to next query step S22, wherein it is determined whether a faulty memory cell F1 is detected in the embedded memory 30. If so, the flow continues to step S23, wherein it is determined whether a row address of the faulty memory cell F1 exists in row fill entries 25. If so, at step S24, the 'Row Hit Count' value is increased by 1, and the flow proceeds to step S25.

However, at step S23, if the row address of the faulty memory cell F1 does not exist in the row fill entries 25, the flow continues to step S29. At step S29, it is determined whether the row fill entries 25 are overflowed. If so, the faulty memory cell F1 is determined to unrepairable. If not, the row address of the faulty memory cell F1 is stored in one of the row fill entries 25 in step S30, and then the flow proceeds to step S25. At step S25, a column fill entry location to store the column address of the faulty memory cell F1 is stored in the row fill entry, and the flow proceeds to step S26 shown in FIG. 10B.

Referring to FIG. 10B, at step S26, it is determined whether a column address of the faulty memory cell F1 exists in column fill entries 26. If so, at step S27, the 'Column Hit Count' value is increased by 1, and the flow proceeds to step S28. If not, at step S31, it is determined whether the column fill entries 26 are overflowed. If so, the faulty memory cell F1 is determined to unrepairable. If not, the column address of the faulty memory cell F1 is stored in one of the column fill entries 26 in step S32, and then the flow proceeds to step S28. At step S28, a row fill entry location to store the row address of the faulty memory cell F1 is stored in the column fill entry, and then the flow returns to step S21 shown in FIG. 10A.

Figure 11A:
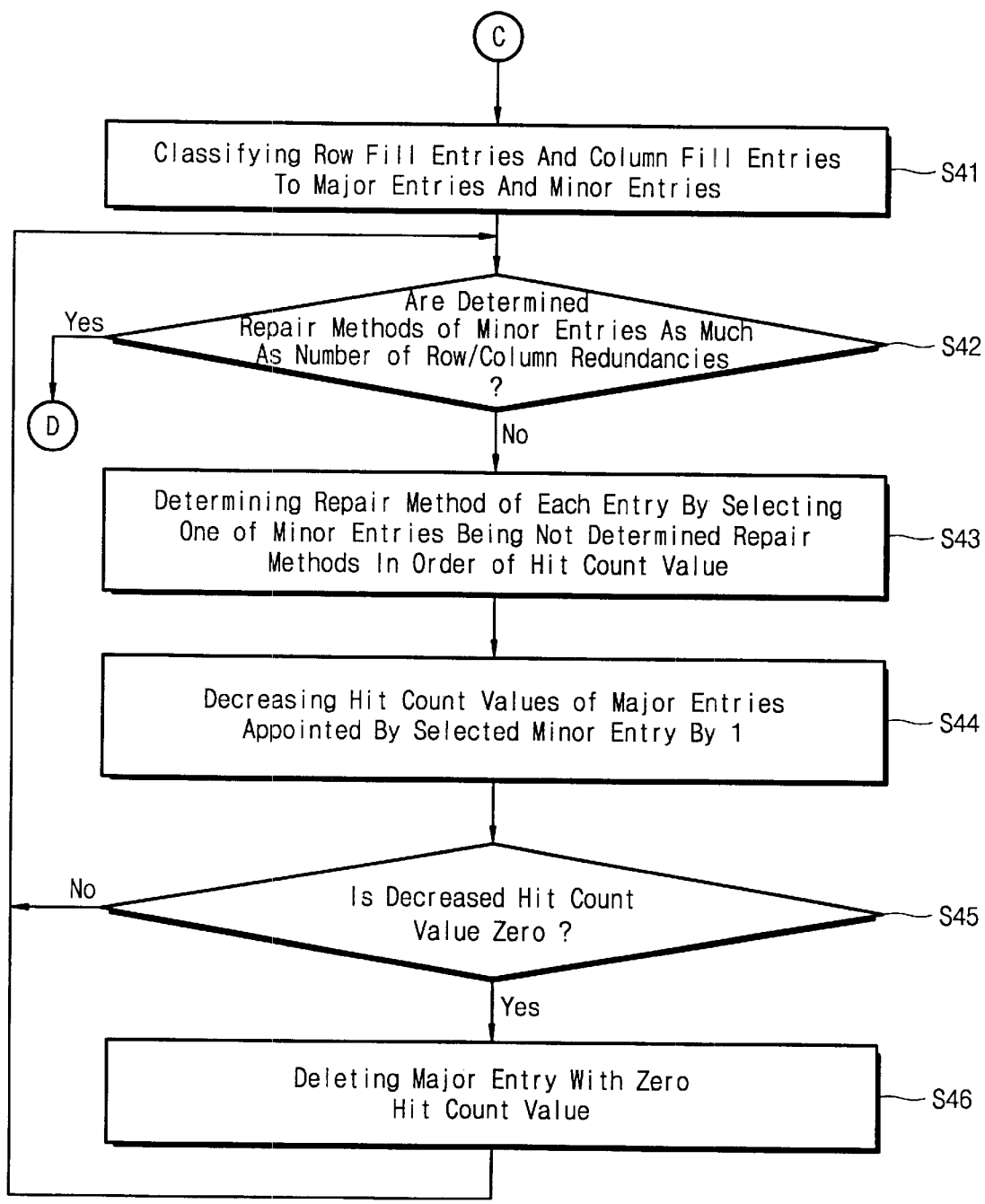
FIGS. 11A and 11B are detailed flowcharts for illustrating the step for determining repair methods of the faulty memory cells shown in FIG. 9.
Figure 11B:
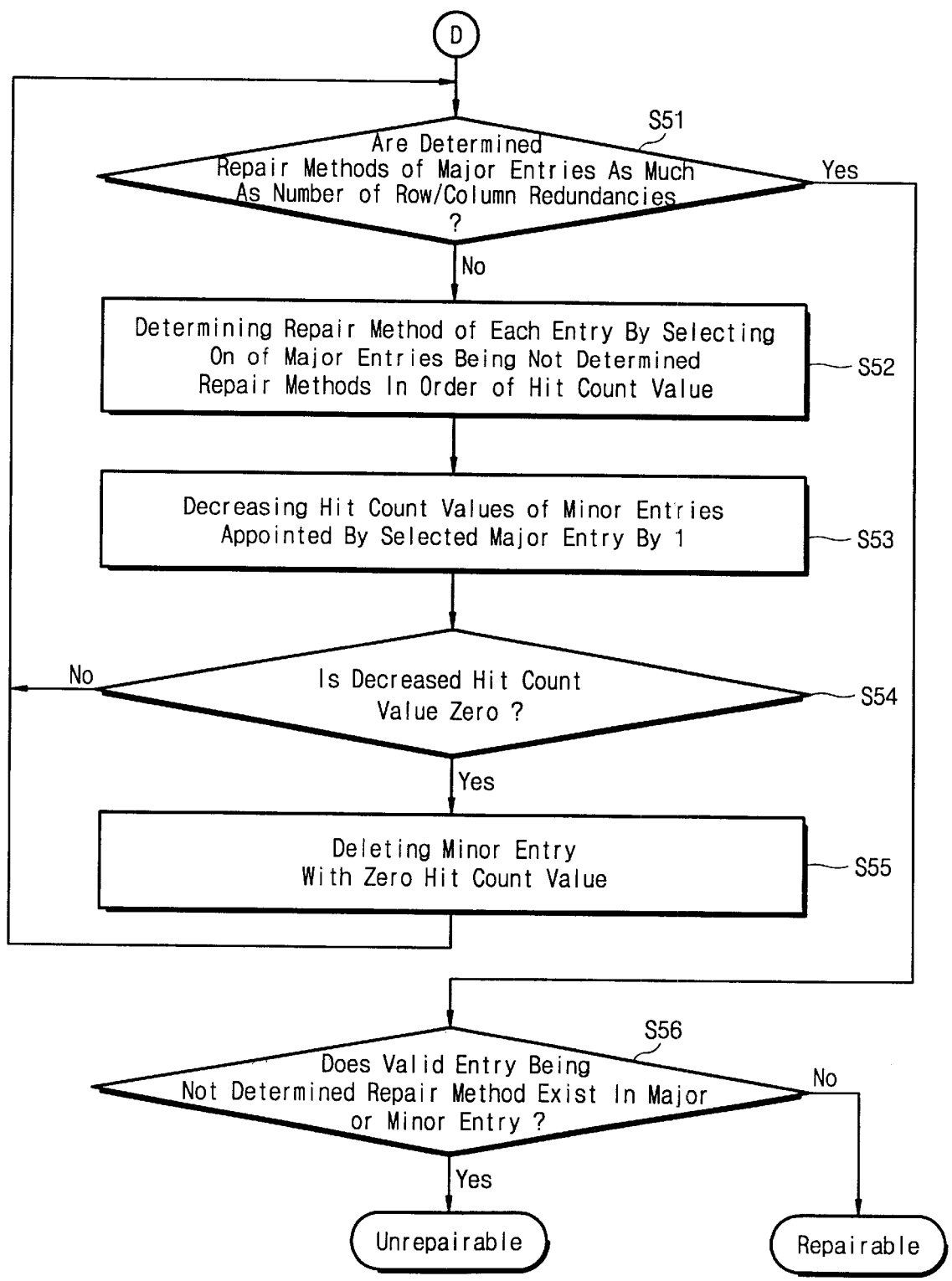

FIGS. 11A and 11B are detailed flowcharts for illustrating the step for determining repair methods of the faulty memory cells shown in FIG. 9. Referring first to FIG. 11A, at step S41, row fill entries 25 and column fill entries 26 are classified into major entries and minor entries by the number of row and column redundancies. At step S42, it is determined whether the repair methods of minor entries are determined as much as the number of the row/column redundancies. If so the flow proceeds to step S51 shown in FIG. 11B. If not, the flow proceeds to step S43, wherein one of minor entries is selected in order of 'Hit Count' value, and the repair method of the selected entry is determined. Continually, at step S44, 'Hit Count' values of major entries appointed by the selected minor entry are decreased by 1. At step S45, it is determined whether the decreased 'Hit Count' value is zero or not. If so, the flow proceeds to step S46, wherein the major entry having the zero 'Hit Count' value is deleted. If not, the flow returns to step S42.

Continually, referring to FIG. 11B, at step S51, it is determined whether repair methods of major entries are determined as much as the number of the row/column redundancies. If so the flow proceeds to step S56, wherein it is determined whether a valid entry being not determined repair method exists in the major entries or the minor entries. If so, the entry is determined to unrepairable. If not, the entry is determined to be a repairable entry.

At step S51, if repair methods of major entries are not determined as much as the number of the row/column redundancies, the flow proceeds to step S52. At step S52, one of major entries is selected in order of 'Hit Count' value, and a repair method of the selected entry is determined. Continually, at step S53, Hit Count values of the minor entries appointed by the selected major entry are decreased by 1. At step S54, it is determined whether the decreased 'Hit Count' value is zero or not. If so, the flow proceeds to step S55, wherein the corresponding minor entry having the zero 'Hit Count' value is deleted and the flow returns to step S51. If not, the flow returns to step S51.

Figure 12:
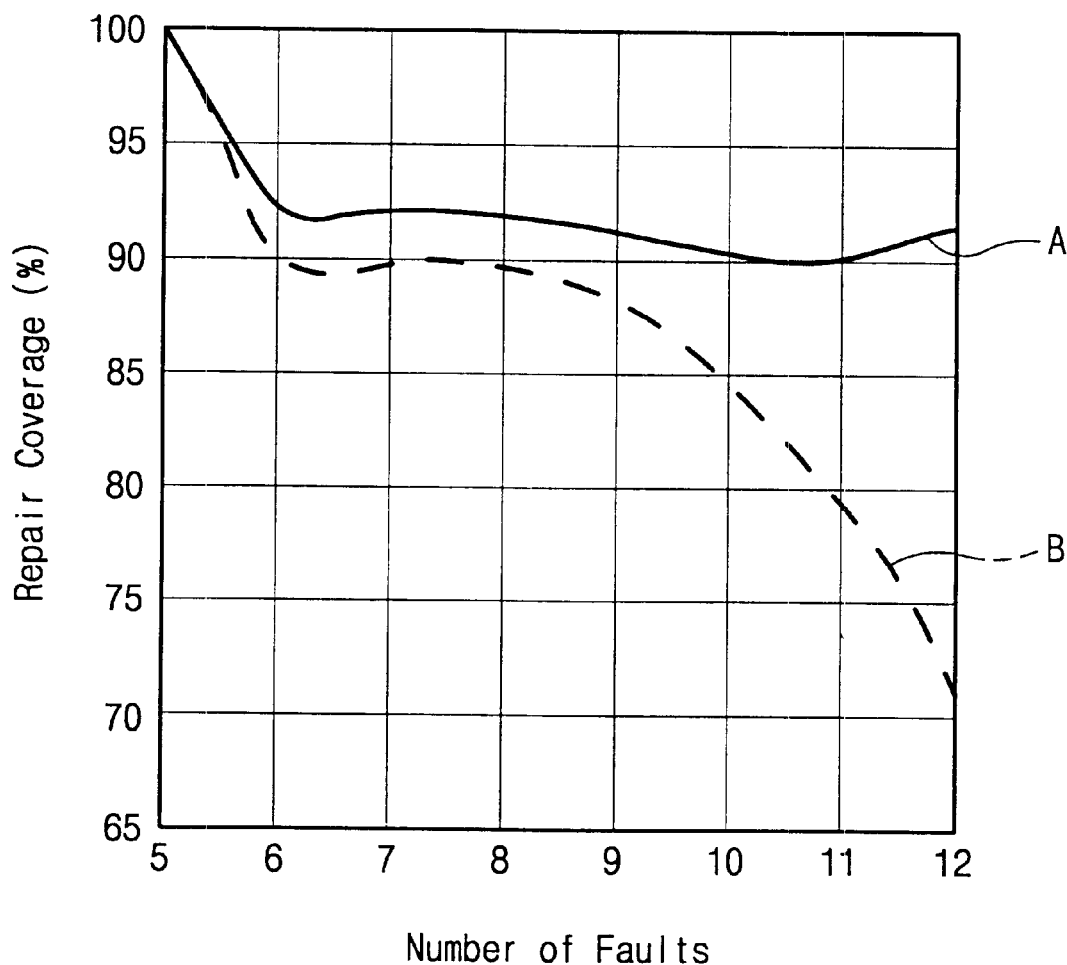
FIG. 12 is a diagram for illustrating repair coverage of the BISR circuit using the row and column fill entries shown in FIGS. 3A and 3B, and the conventional fill entries shown in FIG. 2.

FIG. 12 shows experimental results of repair coverage of the BISR circuit. Referring to FIG. 12, 'A' and 'B' are graphs for illustrating repair coverage of the BISR circuit using the row and column fill entries 25 and 26 shown in FIGS. 3A and 3B, and using the conventional fill entries shown in FIG. 2, respectively. The X-axis represents the number of faults injected in a sparse array. The Y-axis represents the repair coverage. The graphs illustrate experimental results when the numbers of row and column redundancies of the embedded memory 30 are 3 and 2, respectively. To obtain the results shown in FIG. 12, ten million simulations are performed in each number of the faults (for example, 6 to 12), so that the number of simulations totaled to seventy million.

The simulations are performed in case that the number of the faults is 6 to 12. If the number of the faults is 5, the 5 faults can be repaired under any methods, sufficiently, since the sum of the row and column redundancies is 5. Thus, the simulations begin when the number of the faults is 6. In addition, when the numbers of row and column redundancies of the embedded memory 30 are 3 and 2 respectively, the BISR circuit according to the present invention and any BISR circuit according to the conventional method can not repair more than 2×R×C faults (i.e., 2×3×2=12). Thus, the repair coverage exceeding 12 faults is not considered.

As shown in FIG. 12, the repair coverage of the conventional method (refer to B) drops rapidly, compared with the repair coverage of the present invention (refer to A). However, the repair coverage of the present invention maintains almost constant level, although the number of the faults is increased.

Referring to graph 'A' of FIG. 12, the repair coverage of the present invention at the number of the faults is 12 is greater than that at the number of the faults is 11. When the number of the faults is 12, the entries having hit count values greater than the number of the major redundancies (for example, R=3) exist more than the number of the minor entries (for example, C=2) in the minor entry (for example, column fill entry), so that there is increased possibility of selecting the entries to repair the faults with the minor redundancies. In addition, the entries having hit count values greater than the number of the minor redundancies (for example, C=2) exist more than the number of the major entries (for example, R=3) in the major entry (for example, row fill entry), so that there is increased possibility of selecting the entries to repair the faults with the major redundancies. Thus, the repair coverage of the present invention at the number of the faults is 12 is greater than that at the number of the faults is 11.

As shown in FIG. 12, the repair coverage of the conventional method (i.e., 'B') is decreased rapidly in proportion as the number of the faults is increased. However, the repair coverage of the present invention (i.e., 'A') maintains almost constant level, although the number of the faults is increased. In addition, the repair coverage of the conventional method (i.e., 'B') is restricted to the number of the row and column redundancies of the embedded memory. However, the repair coverage of the present invention (i.e., 'A') is not affected by the number of the redundancies.

Therefore, the BISR circuit according to the present invention can maintain almost constant repair coverage, although the number of the redundancies and the number of the faults are increased. Thus, the BISR circuit can repair the faulty memory cells occurred in the embedded memory with multiple redundancies, more exactly.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. An integrated circuit semiconductor device comprising:
    an embedded memory including multiple row and column redundancies;
    a built-in self-test circuit for detecting faulty memory cells of the memory; and
    a built-in self-repair circuit for storing information relating to the detected faulty memory cells by dividing information into row information and column information, for determining repair methods of repairing the faulty memory cells with the row redundancies or column redundancies in response to the row information and column information, and for generating repaired addresses of the memory in response to the determined repair methods, wherein the built-in self-repair circuit includes:
        a built-in self-repair controller for controlling operation of the built-in self-repair circuit;
        a first data storing means including a plurality of entries having a plurality of data fields, for storing row addresses of the faulty memory cells and the number of the faulty memory cells occurring at a common row address;
        a first logic unit for storing the row addresses and the number of the faulty memory cells into the first data storing means under control of the built-in self-repair controller;
        a second data storing means including a plurality of entries having a plurality of data fields, for storing column addresses of the faulty memory cells and the number of the faulty memory cells occurring at a column address;
        a second logic unit for storing the column addresses and the number of the faulty memory cells into the second data storing means under control of the built-in self-repair controller;
        a third logic unit for storing first entry locations of the first data storing means into the second data storing means and storing second entry locations of the second data storing means into the first data storing means, the first and second entry locations respectively indicating column and row addresses corresponding to row and column addresses of the first and second data storing means, and for decreasing the faulty memory cell number stored at the entry locations of the other one of the first and second data storing means under control of the built-in self-repair controller when an entry from one of the first and second data storing means is selected for determining the repair method, and
        an address checker for generating repaired row and column addresses to the memory in response to the row and column addresses of the faulty memory cells under control of the built-in self-repair controller.

2. An integrated circuit semiconductor device according to claim 1, wherein the built-in self-repair circuit first determines the repair methods of either of the first data storing means or the second data storing means, depending on which of the first and second data storing means has fewer entries.

3. An integrated circuit semiconductor device according to claim 1, wherein the built-in self-repair circuit determines the repair methods of the first or second data storing means by selecting entries composing the first or second data storing means in order of decreasing numbers of the stored faulty memory cells.

4. An integrated circuit semiconductor device according to claim 3, wherein when the decreased number of the faulty memory cells is zero for a given entry, the third logic unit deletes the given entry from the first or the second data storing means.

5. An integrated circuit semiconductor device according to claim 1, wherein each entry included in the first data storing means comprises:

a first data field for indicating validity of the row information stored in the entry;

a second data field for storing the row address of the faulty memory cells;

a third data field for storing the number of the faulty memory cells having the same row address as stored in the second data field;

a fourth data field for storing the entry location of the second data storing means storing the column address corresponding to the row address of the faulty memory cells stored in the second data field; and a fifth data field for storing information about the determined repair methods for the faulty memory cells.

6. An integrated circuit semiconductor device according to claim 5, wherein the third data field includes $\lfloor \log_2 C \rfloor+1$ bits, and the fourth data field includes $\lceil \log_2 (C+CR) \rceil$ bits up to a maximum of C, where R and C indicate the numbers of the row and column redundancies; for the memory, respectively.

7. An integrated circuit semiconductor device according to claim 5, wherein the third data field is composed of C+1 bits including a least significant bit being set to 1 which is incremented by 1 whenever the faulty memory cell having the same row address is detected, and the fourth data field is composed of C bits for indicating the entry location as bit flags, where R and C indicate the numbers of the row and column redundancies for the memory, respectively.

8. An integrated circuit semiconductor device according to claim 1, wherein each entry included in the second data storing means comprises:

a first data field for indicating validity of the column information stored in the entry;

a second data field for storing the column address of the faulty memory cells;

a third data field for storing the number of the faulty memory cells having the same column address as stored in the second data field;

a fourth data field for storing the entry location of the first data storing means storing the row address corresponding to the column address of the faulty memory cells stored in the second data field; and a fifth data field for storing information about the determined repair methods for the faulty memory cells.

9. An integrated circuit semiconductor device of according to claim 8, wherein the third data field is composed of $\lfloor \log_2 R \rfloor+1$ bits, and the fourth data field is composed of $\lceil \log_2 (R+RC) \rceil$ bits, up to a maximum of R, where R and C indicate the numbers of the row and column redundancies for the memory, respectively.

10. An integrated circuit semiconductor device of according to claim 8, wherein the third data field is composed of R+1 bits including a least significant bit being set to 1 which is incremented by 1 whenever the faulty memory cell having the same column address is detected, and the fourth data field is composed of R bits for indicating the entry location as bit flags, where R and C indicate the numbers of the row and column redundancies for the memory, respectively.

11. A self-repair method of a built-in self-repair circuit for an embedded memory having multiple redundancies, comprising the steps of:

filling row and column information into first and second data storing means respectively, wherein the row information includes row addresses of faulty memory cells in the embedded memory, the number of the faulty memory cells having a common row, and first entry locations of the second data storing means, and wherein the column information includes column addresses of the faulty memory cells, the number of the faulty memory cells having a common column, and second entry locations of the first data storing means;

determining repair methods of repairing the faulty memory cells, up to the maximum number of row or column redundancies by selecting an entry included in the first or the second data storing means in order of decreasing numbers of the faulty memory cells stored in the entry, and decreasing the faulty memory cell number stored in the entry locations of the other one of the first and second data storing means appointed by the selected entry; and generating repaired addresses to the memory according to the determined repair methods.

12. A method according to claim 11, wherein each entry included in the first data storing means comprises:

a first data field for indicating validity of the row information stored in the entry;

a second data field for storing the row address of the faulty memory cells;

a third data field for storing the number of the faulty memory cells having the same row address as stored in the second data field;

a fourth data field for storing the entry location of the second data storing means storing the column address corresponding to the row address of the faulty memory cells stored in the second data field; and a fifth data field for storing information about the determined repair methods for the faulty memory cells.

13. A method according to claim 11, wherein each entry included in the second data storing means comprises:

a first data field for indicating validity of the column information stored in the entry;

a second data field for storing the column address of the faulty memory cells;

a third data field for storing the number of the faulty memory cells having the same column address as stored in the second data field;

a fourth data field for storing the entry location of the first data storing means storing the row address corresponding to the column address of the faulty memory cells stored in the second data field; and a fifth data field for storing information about the determined repair methods for the faulty memory cells.

14. A method according to claim 12, wherein the step for filling row/column information to the first/second data storing means comprises the steps of:

determining whether a row address of a faulty memory cell is stored in the first data storing means;

if the row address of the faulty memory cell is stored in the first data storing means, increasing the number of faulty memory cells by 1 stored in the third data field of the first data storing means, and storing an entry location of the second data storing means to the fourth data field;

if the row address of the faulty memory cell is not stored in the first data storing means, storing the row address in the first data storing means, and storing the entry location of the second data storing means in the fourth data field;

determining whether a column address of the faulty memory cell is stored in the second data storing means;

if the column address of the faulty memory cell is stored in the second data storing means, increasing the number of faulty memory cells by 1 stored in the third data field of the second data storing means, and storing an entry location of the first data storing means to the fourth data field; and if the column address of the faulty memory cell is not stored in the second data storing means, storing the column address to the second data storing means, and storing the entry location of the first data storing means in the fourth data field.

15. A method according to claim 13, wherein the step for filling row/column information to the first/second data storing means comprises the steps of:

determining whether a row address of a faulty memory cell is stored in the first data storing means;

if the row address of the faulty memory cell is stored in the first data storing means, increasing the number of faulty memory cells by 1 stored in the third data field of the first data storing means, and storing an entry location of the second data storing means in the fourth data field;

if the row address of the faulty memory cell is not stored in the first data storing means, storing the row address in the first data storing means, and storing the entry location of the second data storing means in the fourth data field;

determining whether a column address of the faulty memory cell is stored in the second data storing means;

if the column address of the faulty memory cell is stored in the second data storing means, increasing the number of faulty memory cells by 1 stored in the third data field of the second data storing means, and storing an entry location of the first data storing means in the fourth data field; and if the column address of the faulty memory cell is not stored in the second data storing means, storing the column address in the second data storing means, and storing the entry location of the first data storing means in the fourth data field.

16. A method according to claim 11, wherein the step for determining repair methods comprises the steps of:

(a) selecting either the first data storing means or the second data storing means having fewer entries;

(b) determining a repair method of the selected data storing means by selecting the entry in order of decreasing numbers of the faulty memory cells;

(c) decreasing the number of the faulty memory cells stored in the entry location of the other one of the first and second data storing means appointed by the selected entry;

(d) repeating the (b) and (c) steps a number of times equal to the number of the row/column redundancies corresponding to the selected data storing means;

(e) selecting one of the first and second data storing means, wherein the selected data storing means has more entries than the other; and (f) repeating the (b) and (c) steps a number of times equal to the number of the row/column redundancies corresponding to the selected data storing means.

17. A method according to claim 16, wherein the determined repair methods employ the row redundancies.

18. A method according to claim 16, wherein the determined repair methods employ the column redundancies.

19. A method according to claim 16, wherein the entry of the other one of the first and second data storing means is deleted when the decreased number of the faulty memory cells is zero.

* * * * *

UNITED STATES PATENT AND TRADEMARK OFFICE
CERTIFICATE OF CORRECTION

PATENT NO.     : 6,574,757 B1                                              Page 1 of 1
DATED          : June 3, 2003
INVENTOR(S)    : Jin-Young Park et al.

It is certified that error appears in the above-identified patent and that said Letters Patent is hereby corrected as shown below:

<u>Column 17,</u>
Line 63, after "device", delete "of".

Signed and Sealed this

Twenty-third Day of September, 2003

JAMES E. ROGAN
*Director of the United States Patent and Trademark Office*